(12) United States Patent
Lee et al.

(10) Patent No.: US 11,997,881 B2
(45) Date of Patent: May 28, 2024

(54) DISPLAY APPARATUS AND METHOD OF MANUFACTURING THE SAME

(71) Applicant: Samsung Display Co., Ltd., Yongin-Si (KR)

(72) Inventors: Junhee Lee, Yongin-si (KR); Minyeul Ryu, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 148 days.

(21) Appl. No.: 17/496,828

(22) Filed: Oct. 8, 2021

(65) Prior Publication Data
US 2022/0336557 A1    Oct. 20, 2022

(30) Foreign Application Priority Data
Apr. 19, 2021    (KR) .................. 10-2021-0050741

(51) Int. Cl.
*H01L 29/08*     (2006.01)
*H10K 59/121*    (2023.01)
*H10K 59/122*    (2023.01)
*H10K 59/12*     (2023.01)

(52) U.S. Cl.
CPC ..... *H10K 59/1213* (2023.02); *H10K 59/1216* (2023.02); *H10K 59/122* (2023.02); *H10K 59/1201* (2023.02)

(58) Field of Classification Search
CPC ........... H10K 59/1213; H10K 59/1216; H10K 59/122; H10K 59/1201
USPC ........................................................ 257/40
See application file for complete search history.

(56) References Cited

U.S. PATENT DOCUMENTS

| | | | |
|---|---|---|---|
| 10,763,317 B2 | 9/2020 | Lee et al. | |
| 2017/0322471 A1* | 11/2017 | Jeong | ................ G02F 1/134309 |
| 2019/0245017 A1* | 8/2019 | Jeon | ..................... H10K 50/865 |
| 2019/0280068 A1* | 9/2019 | Shin | ................... H10K 59/1201 |
| 2020/0285090 A1 | 9/2020 | Tanaka | |
| 2020/0381651 A1 | 12/2020 | Wang | |

FOREIGN PATENT DOCUMENTS

| | | | | |
|---|---|---|---|---|
| CN | 111210732 A | * | 5/2020 | ........... G06F 3/0412 |
| KR | 20080085411 A | * | 9/2008 | ............... H01C 7/12 |
| KR | 10-2087103 B1 | | 3/2020 | |
| KR | 20210092861 A | * | 7/2021 | ......... H10K 59/1213 |

* cited by examiner

*Primary Examiner* — Phuc T Dang
(74) *Attorney, Agent, or Firm* — Innovation Counsel LLP

(57) ABSTRACT

Provided are a display apparatus including: a substrate; a pixel circuit disposed over the substrate and comprising a thin film transistor and a storage capacitor; an insulating layer covering the pixel circuit; a bridge electrode disposed over the insulating layer and electrically connected to the pixel circuit through a contact hole formed in the insulating layer; a pixel electrode disposed over the insulating layer and electrically connected to the bridge electrode; a pixel definition layer disposed over the pixel electrode and including an opening overlapping a portion of the pixel electrode; an opposite electrode over the pixel electrode; and an emission layer disposed between the pixel electrode and the opposite electrode, wherein the pixel electrode does not overlap the contact hole of the insulating layer in a plan view.

15 Claims, 30 Drawing Sheets

DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Application No. 10-2021-0050741, filed on Apr. 19, 2021, in the Korean Intellectual Property Office, the disclosure of which is incorporated by reference herein in its entirety.

BACKGROUND

1. Field

One or more embodiments relate to a display apparatus and a method of manufacturing the same.

2. Description of the Related Art

Display apparatuses provide visual information such as images or videos to users. With the development of various electronic apparatuses such as computers and large televisions (TVs), various types of display apparatuses applicable thereto have been developed. Recently, mobility-based electronic apparatuses have been widely used, and mobile electronic apparatuses such as mobile phones and tablet personal computers (PCs) have been widely used.

Among various display apparatuses, organic light emitting display apparatuses have been widely used because they have advantages such as a wide viewing angle, excellent contrast, and a high response rate. Generally, in an organic light emitting display apparatus, a thin film transistor and organic light emitting diodes which emit light by themselves are formed over a substrate.

SUMMARY

However, there may be a problem in that external light is reflected from the surface of a display apparatus and then visually recognized by a user. In order to minimize this problem, the display apparatus may include a polarization layer or the like; however, this may cause an increase in the thickness of the display apparatus, a decrease in the light efficiency thereof, or the like.

In order to solve various problems including the above problems, one or more embodiments include a display apparatus in which an external light reflectance at the surface thereof is reduced and a method of manufacturing the display apparatus. However, these problems are merely examples and the scope of the disclosure is not limited thereto.

Additional aspects will be set forth in part in the description which follows and, in part, will be apparent from the description, or may be learned by practice of the presented embodiments.

According to one or more embodiments, a display apparatus includes a substrate, a pixel circuit disposed over the substrate and including a thin film transistor and a storage capacitor, an insulating layer covering the pixel circuit, a bridge electrode disposed over the insulating layer and electrically connected to the pixel circuit through a contact hole formed in the insulating layer, a pixel electrode disposed over the insulating layer and electrically connected to the bridge electrode, a pixel definition layer disposed over the pixel electrode and defining an opening overlapping a portion of the pixel electrode, an opposite electrode over the pixel electrode, and an emission layer disposed between the pixel electrode and the opposite electrode, wherein the pixel electrode does not overlap the contact hole of the insulating layer in a plan view.

According to the present embodiments, at least a portion of the bridge electrode may overlap the opening of the pixel definition layer in a plan view.

According to the present embodiments, the bridge electrode may include a transparent conductive oxide.

According to the present embodiments, an area of the bridge electrode may be greater than an area of the pixel electrode in a plan view.

According to the present embodiments, the at least a portion of the bridge electrode may be disposed over the pixel electrode.

According to the present embodiments, the pixel electrode may include a conductive layer including a transparent conductive oxide, and a reflective layer disposed over the conductive layer and including a metal, wherein the at least a portion of the bridge electrode may contact an upper surface of the reflective layer of the pixel electrode.

According to the present embodiments, the pixel electrode may include a lower conductive layer including a transparent conductive oxide, a reflective layer disposed over the lower conductive layer and including a metal, and an upper conductive layer disposed over the reflective layer and including a transparent conductive oxide, wherein the at least a portion of the bridge electrode may contact an upper surface of the upper conductive layer of the pixel electrode.

According to the present embodiments, the at least a portion of the bridge electrode may be disposed between the insulating layer and the pixel electrode.

According to the present embodiments, the pixel electrode may include a reflective layer including a metal, and a conductive layer disposed over the reflective layer and including a transparent conductive oxide, wherein the at least a portion of the bridge electrode may contact a lower surface of the reflective layer of the pixel electrode.

According to the present embodiments, the pixel electrode may include a lower conductive layer including a transparent conductive oxide, a reflective layer disposed over the lower conductive layer and including a metal, and an upper conductive layer disposed over the reflective layer and including a transparent conductive oxide, wherein the at least a portion of the bridge electrode may contact a lower surface of the lower conductive layer of the pixel electrode.

According to the present embodiments, the bridge electrode may include a first bridge electrode layer disposed between the insulating layer and the pixel electrode, and a second bridge electrode layer disposed over the first bridge electrode layer, wherein the pixel electrode may be disposed between the first bridge electrode layer and the second bridge electrode layer of the bridge electrode.

According to the present embodiments, the pixel electrode may include a reflective layer including a metal, and the first bridge electrode layer may contact a lower surface of the reflective layer of the pixel electrode.

According to the present embodiments, the pixel electrode may further include a conductive layer disposed over the reflective layer and including a transparent conductive oxide, and the second bridge electrode layer may contact an upper surface of the conductive layer of the pixel electrode.

According to the present embodiments, the pixel definition layer may include a light blocking material.

According to one or more embodiments, a method of manufacturing a display apparatus includes forming a pixel circuit including a thin film transistor and a storage capacitor over a substrate, forming an insulating layer covering the pixel circuit and including at least one contact hole, forming a bridge electrode disposed over the insulating layer and electrically connected to the pixel circuit through the at least one contact hole of the insulating layer, forming a pixel electrode disposed over the insulating layer and electrically connected to the bridge electrode, forming a pixel definition layer disposed over the pixel electrode and defining an opening overlapping a portion of the pixel electrode, forming an emission layer over the pixel electrode, and forming an opposite electrode over the emission layer, wherein the forming of the pixel electrode includes forming a pixel electrode material layer, and patterning the pixel electrode material layer such that the pixel electrode does not overlap the contact hole of the insulating layer in a plan view.

According to the present embodiments, the forming of the bridge electrode may include forming a bridge electrode material layer, and patterning the bridge electrode material layer such that at least a portion of the bridge electrode may overlap the opening of the pixel definition layer in a plan view.

According to the present embodiments, the bridge electrode may include a transparent conductive oxide.

According to the present embodiments, the pixel electrode may include a conductive layer including a transparent conductive oxide, and a reflective layer disposed over the conductive layer and including a metal, wherein the at least a portion of the bridge electrode may be disposed over the pixel electrode and may contact an upper surface of the reflective layer of the pixel electrode.

According to the present embodiments, the pixel electrode may include a lower conductive layer including a transparent conductive oxide, a reflective layer disposed over the lower conductive layer and including a metal, and an upper conductive layer disposed over the reflective layer and including a transparent conductive oxide, wherein the at least a portion of the bridge electrode may be disposed over the pixel electrode and may contact an upper surface of the upper conductive layer of the pixel electrode.

According to the present embodiments, the pixel electrode may include a reflective layer including a metal, and a conductive layer disposed over the reflective layer and including a transparent conductive oxide, wherein the at least a portion of the bridge electrode may be disposed between the insulating layer and the pixel electrode and may contact a lower surface of the reflective layer of the pixel electrode.

According to the present embodiments, the pixel electrode may include a lower conductive layer including a transparent conductive oxide, a reflective layer disposed over the lower conductive layer and including a metal, and an upper conductive layer disposed over the reflective layer and including a transparent conductive oxide, wherein the at least a portion of the bridge electrode may be disposed between the insulating layer and the pixel electrode and may contact a lower surface of the lower conductive layer of the pixel electrode.

According to one or more embodiments, a method of manufacturing a display apparatus includes forming a pixel circuit including a thin film transistor and a storage capacitor over a substrate, forming an insulating layer covering the pixel circuit and including at least one contact hole, forming a first bridge electrode layer disposed over the insulating layer and electrically connected to the pixel circuit through the at least one contact hole of the insulating layer, forming a pixel electrode disposed over the first bridge electrode layer, forming a second bridge electrode layer disposed over the first bridge electrode layer with the pixel electrode disposed between the first bridge electrode and the second bridge electrode, forming a pixel definition layer disposed over the pixel electrode and defining an opening overlapping a portion of the pixel electrode, forming an emission layer over the pixel electrode, and forming an opposite electrode over the emission layer, wherein the forming of the pixel electrode includes forming a pixel electrode material layer, and patterning the pixel electrode material layer such that the pixel electrode does not overlap the contact hole of the insulating layer in a plan view.

According to the present embodiments, the pixel electrode may include a reflective layer including a metal, and the first bridge electrode layer may contact a lower surface of the reflective layer of the pixel electrode.

According to the present embodiments, the pixel electrode may further include a conductive layer disposed over the reflective layer and including a transparent conductive oxide, and the second bridge electrode layer may contact an upper surface of the conductive layer of the pixel electrode.

Other aspects, features, and advantages other than those described above will become apparent from the following detailed description, the appended claims, and the accompanying drawings.

These general and particular aspects may be implemented by using systems, methods, computer programs, or any combinations of systems, methods, and computer programs.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
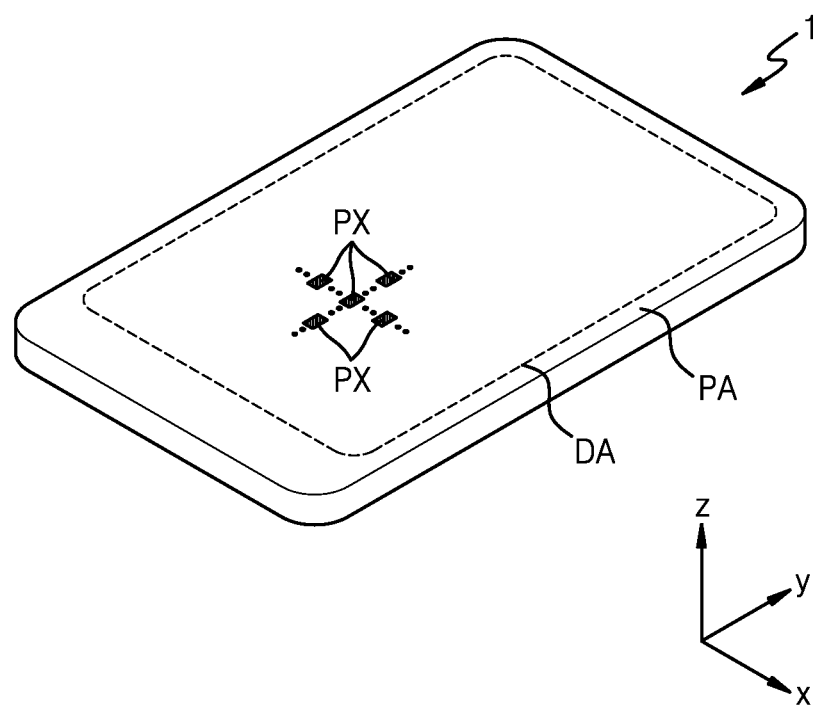
FIG. 1 is a plan view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

Also, it will be understood that the terms "comprise," "include," and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of elements in the drawings may be exaggerated for convenience of description. In other words, because the sizes and thicknesses of elements in the drawings are arbitrarily illustrated for convenience of description, the disclosure is not limited thereto.

When a certain embodiment may be implemented differently, a particular process order may be performed differently from the described order. For example, two consecutively described processes may be performed substantially at the same time or may be performed in an order opposite to the described order.

As used herein, "A and/or B" represents the case of A, B, or A and B. Also, "at least one of A and B" represents the case of A, B, or A and B.

It will be understood that when a layer, region, or component is referred to as being "connected to" another layer, region, or component, it may be "directly connected to" the other layer, region, or component and/or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

The x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

FIG. 1 is a plan view schematically illustrating a display apparatus according to an embodiment.

Referring to FIG. 1, a display apparatus 1 may include a display area DA and a peripheral area PA disposed outside the display area DA. The display apparatus 1 may provide an image through an array of a plurality of pixels PX in the display area DA. The pixel PX may be defined as an emission area in which a light emitting element driven by a pixel circuit emits light. That is, an image may be provided by the light emitted by the light emitting element through the pixel PX. Not only light emitting elements and pixel circuits but also various signal lines and power lines electrically connected to the pixel circuits may be disposed in the display area DA.

The peripheral area PA may be an area that does not provide an image and may entirely or partially surround the display area DA. Various lines, driving circuits, or the like for providing electrical signals or power to the display area DA may be disposed in the peripheral area PA.

The display apparatus 1 may substantially have a rectangular shape in a view in a direction perpendicular to one surface thereof. For example, as illustrated in FIG. 1, the display apparatus 1 may substantially have a rectangular planar shape having a short side extending in the x direction and a long side extending in the y direction. A corner where the short side in the x-direction meets the long side in the y-direction may have a rectangular shape or a round shape having a certain curvature, as illustrated in FIG. 1. However, the planar shape of the display apparatus 1 is not limited to a rectangular shape and may include various shapes such as polygonal shapes such as triangular shapes, circular shapes, elliptical shapes, and atypical shapes.

Although FIG. 1 illustrates the display apparatus 1 having a flat display surface, the disclosure is not limited thereto. In other embodiments, the display apparatus 1 may include a three-dimensional display surface or a curved display surface. When the display apparatus 1 includes a three-dimensional display surface, the display apparatus 1 may include a plurality of display areas facing different directions and may include, for example, a polygonal columnar display surface. In other embodiments, when the display apparatus 1 includes a curved display surface, the display apparatus 1 may be implemented in various forms such as flexible, foldable, and rollable display apparatuses.

Moreover, for convenience of description, a case where the display apparatus 1 is used in a smart phone will be described below; however, the display apparatus 1 of the disclosure is not limited thereto. The display apparatus 1 may be used as a display screen of various products such as televisions, notebook computers, monitors, billboards, and Internet of Things (IoT) as well as portable electronic apparatuses such as mobile phones, smart phones, tablet personal computers (PCs), mobile communication terminals, electronic notebooks, electronic books, portable multimedia players (PMPs), navigation, and Ultra Mobile PCs (UMPCs). Also, the display apparatus 1 according to an embodiment may be used in wearable devices such as smart watches, watch phones, glasses-type displays, and head-mounted displays (HMDs). Also, the electronic apparatus 1 according to an embodiment may be used as a center information display (CID) disposed at a vehicle's instrument panel or a vehicle's center fascia or dashboard, a room mirror display replacing a vehicle's side mirror, or a display screen disposed at a rear side of a vehicle's front seat as entertainment for a vehicle's rear seat.

Hereinafter, the display apparatus 1 including an organic light emitting diode OLED as a display element will be described; however, the display apparatus 1 of the disclosure is not limited thereto. In other embodiments, the display apparatus 1 may include a light emitting display apparatus including an inorganic light emitting diode, that is, an inorganic light emitting display apparatus. In other embodiments, the display apparatus 1 may include a quantum dot light emitting display apparatus.

Figure 2:
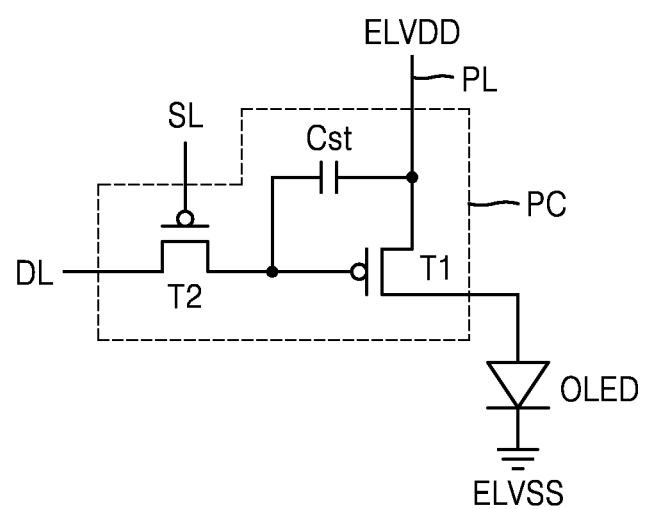
FIG. 2 is an equivalent circuit diagram of a pixel circuit included in a display apparatus according to an embodiment.

FIG. 2 is an equivalent circuit diagram of a pixel circuit included in a display apparatus according to an embodiment.

Referring to FIG. 2, a pixel circuit PC may include a plurality of thin film transistors and a storage capacitor and may be electrically connected to an organic light emitting diode OLED. In an embodiment, the pixel circuit PC may include a driving thin film transistor T1, a switching thin film transistor T2, and a storage capacitor Cst.

The switching thin film transistor T2 may be connected to a scan line SL and a data line DL and may be configured to transmit a data voltage or a data signal input from the data line DL to the driving thin film transistor T1 in response to a switching voltage or a scan signal input from the scan line SL. The storage capacitor Cst may be connected between the switching thin film transistor T2 and a driving voltage line PL and may store a voltage corresponding to the difference between a voltage received from the switching thin film transistor T2 and a first power voltage ELVDD supplied from the driving voltage line PL.

The driving thin film transistor T1 may be connected between the driving voltage line PL and the organic light emitting diode OLED and may control a driving current flowing from the driving voltage line PL through the organic light emitting diode OLED in response to a voltage value stored in the storage capacitor Cst. An opposite electrode (e.g., a cathode) of the organic light emitting diode OLED may supply a second power voltage ELVSS. The organic light emitting diode OLED may emit light with a certain brightness according to the driving current.

Although a case where the pixel circuit PC includes two thin film transistors and one storage capacitor has been described above, the disclosure is not limited thereto. For example, the pixel circuit PC may include three or more thin film transistors and/or two or more storage capacitors. In an embodiment, the pixel circuit PC may include seven thin film transistors and one storage capacitor. The number of thin film transistors and the number of storage capacitors may be variously modified according to the design of the pixel circuit PC. However, hereinafter, for convenience of description, a case where the pixel circuit PC includes two thin film transistors and one storage capacitor will be described.

Figure 3:
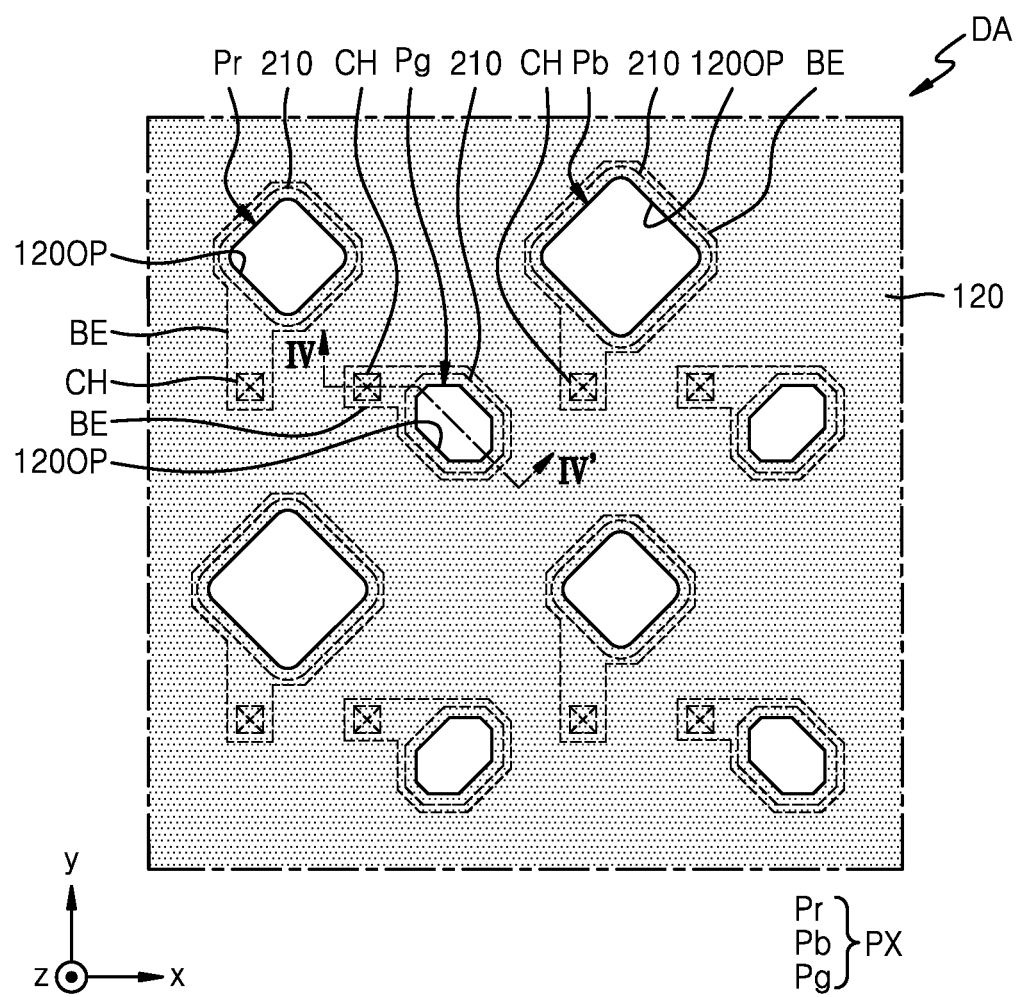
FIG. 3 is a plan view schematically illustrating some configurations of a display apparatus according to an embodiment.

FIG. 3 is a plan view schematically illustrating some configurations of a display apparatus according to an embodiment, which mainly illustrates a display area of the display apparatus.

Referring to FIG. 3, a plurality of pixels PX may be disposed in the display area DA. One pixel PX may include an emission area in which a light emitting element, for example, an organic light emitting diode, emits light. Herein, the pixel PX may be a subpixel emitting red, green, blue, or white light.

In an embodiment, the plurality of pixels PX may include a red pixel Pr, a green pixel Pg, and a blue pixel Pb. The red pixel Pr, the green pixel Pg, and the blue pixel Pb may respectively emit red light, green light, and blue light, wherein the red light may be in a wavelength band of about 580 nm to about 780 nm, the green light may be in a wavelength band of about 495 nm to about 580 nm, and the blue light may be in a wavelength band of about 400 nm to about 495 nm. In other embodiments, the plurality of pixels PX may further include a white pixel (not illustrated).

A plurality of pixel electrodes 210, a pixel definition layer 120, a plurality of emission layers (not illustrated), and an opposite electrode (not illustrated) may be disposed in the display area DA. The plurality of pixel electrodes 210 may be disposed to be spaced apart from each other in the plan view. Because the plurality of pixel electrodes 210 may be disposed under the pixel definition layer 120, the edge of each pixel electrode 210 is illustrated by a dashed line in FIG. 3.

The pixel definition layer 120 may include an opening 120OP exposing a center portion of each of the plurality of pixel electrodes 210. The emission layers emitting light of a certain color may be respectively disposed in the openings 120OP of the pixel definition layer 120. The opposite electrode may be disposed over the pixel definition layer 120 and the emission layers and may be integrally formed over the plurality of pixel electrodes 210. The stack structure of the pixel electrode 210, the emission layer, and the opposite electrode may form one organic light emitting diode.

One opening 120OP of the pixel definition layer 120 may be formed to correspond to one organic light emitting diode and may form one emission area. That is, each opening 120OP of the pixel definition layer 120 may be formed to correspond to one pixel PX.

In an embodiment, a plurality of bridge electrodes BE may be disposed in the display area DA. Because the plurality of bridge electrodes BE are also disposed under the pixel definition layer 120 like the pixel electrode 210, the edge of each bridge electrode BE is illustrated by a dashed line in FIG. 3.

Each bridge electrode BE may be formed to correspond to each pixel electrode 210. Here, two components 'corresponding' to each other may mean that the two components overlap each other in a view in a direction perpendicular to one surface of the display apparatus 1. The bridge electrode BE may be electrically connected to the corresponding pixel electrode 210 and, for example, may directly contact the pixel electrode 210.

In an embodiment, the bridge electrode BE may include an extension portion extending in one direction (e.g., +x direction, −x direction, +y direction, or −y direction) from the corresponding pixel electrode 210 in the plan view. The extension portion may overlap a contact hole CH in the plan view. That is, the bridge electrode BE may be disposed to overlap the contact hole CH. The contact hole CH may be a through hole defined in an insulating layer disposed under the bridge electrode BE, and the bridge electrode BE may be electrically connected through the contact hole CH to the pixel circuit PC (see FIG. 2) disposed thereunder. Thus, the bridge electrode BE may electrically connect the pixel electrode 210 to the pixel circuit PC.

On the other hand, as illustrated in FIG. 3, when the contact hole CH does not overlap the opening 120OP of the pixel definition layer 120 in the plan view, the pixel electrode 210 may not overlap the contact hole CH in the plan view.

In an embodiment, the area of the bridge electrode BE may be greater than the area of the pixel electrode 210 in the plan view. As described below with reference to FIG. 4, the pixel electrode 210 may include a reflective layer 212 including a metal. The reflective layer 212 may reflect external light incident toward the display apparatus 1, and the reflected external light may be visually recognized by the user. As the area of the pixel electrode 210 increases, the external light reflectance thereof may increase and thus visibility of an image displayed by the display apparatus 1 may degrade. Thus, in order to improve this, in an embodiment, the bridge electrode BE including a transparent conductive oxide may be used to reduce the area of the pixel electrode 210 and minimize the external light reflectance.

Moreover, although FIG. 3 illustrates that the plurality of pixels PX are disposed in an RGBG type (a so-called Pentile® structure), they may be disposed in various shapes such as a stripe type.

Figure 4:
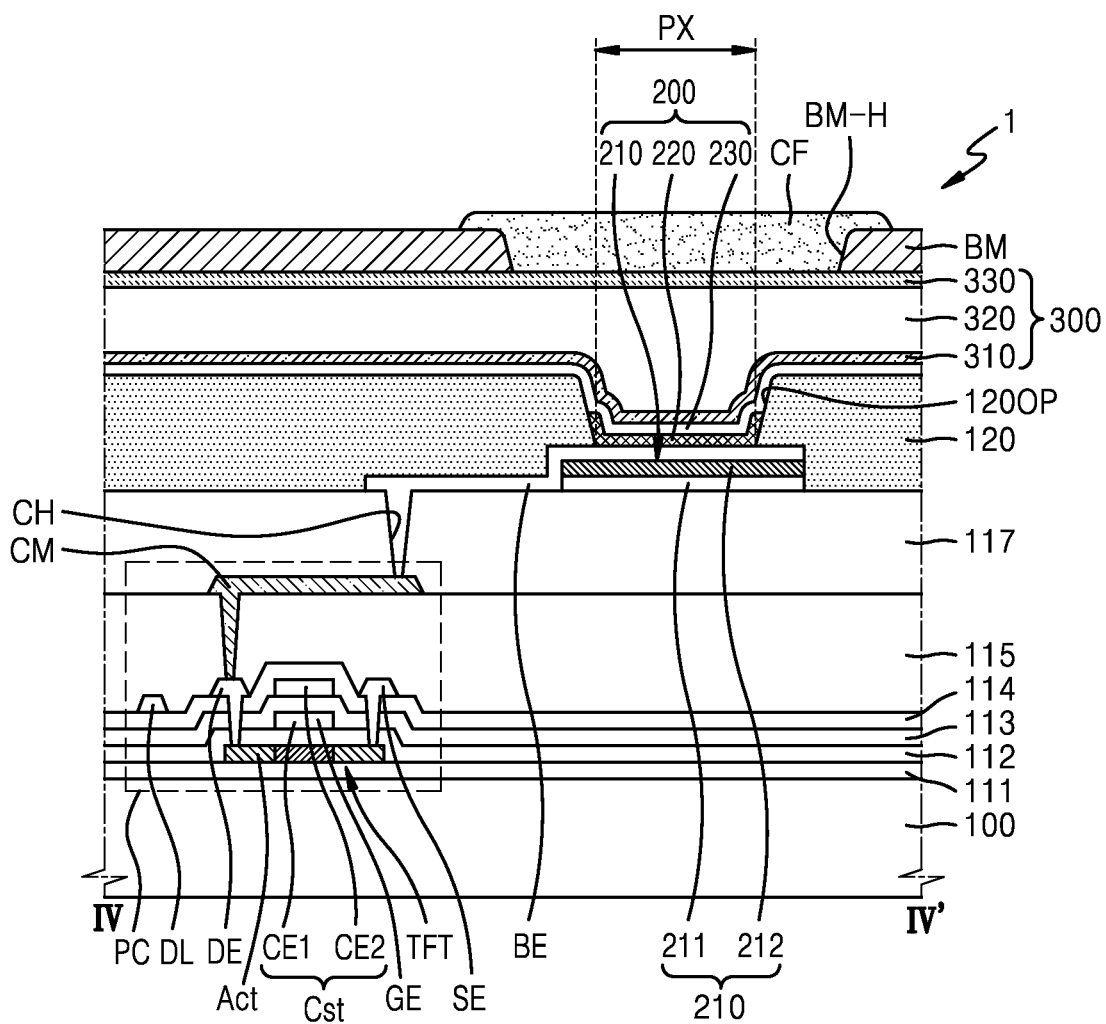
FIG. 4 is a cross-sectional view schematically illustrating a portion of a display apparatus according to an embodiment.

FIG. 4 is a cross-sectional view schematically illustrating a portion of a display apparatus according to an embodiment, which may correspond to a cross-sectional view of the display apparatus taken along line IV-IV' of FIG. 3.

Referring to FIG. 4, a display apparatus 1 may include a light emitting element 200, and the light emitting element 200 may be electrically connected to a pixel circuit PC such that the light emission thereof may be controlled. In an embodiment, the light emitting element 200 may be an organic light emitting diode OLED. Hereinafter, a stack structure of the pixel circuit PC and the light emitting element 200 will be described.

First, the display apparatus 1 may include a substrate 100. The substrate 100 may include glass material or polymer resin. In an embodiment, the substrate 100 may include a plurality of sublayers. The plurality of sublayers may be a structure in which an organic layer and an inorganic layer are alternately stacked. When the substrate 100 includes a polymer resin, the substrate 100 may include polyethersulfone, polyacrylate, polyetherimide, polyethylene naphthalate, polyethylene terephthalate, polyphenylene sulfide, polyarylate, polyimide, polycarbonate, or cellulose acetate propionate.

A buffer layer 111 may be disposed over the substrate 100. The buffer layer 111 may be formed to prevent impurities from penetrating into a semiconductor layer Act of a thin film transistor TFT. In an embodiment, the buffer layer 111 may include an inorganic insulating material such as silicon nitride, silicon oxynitride, or silicon oxide and may include a single layer or multiple layers including the inorganic insulating material.

A pixel circuit PC may be disposed over the buffer layer 111. In an embodiment, the pixel circuit PC may be disposed corresponding to each pixel PX. The pixel circuit PC may include a plurality of thin film transistors TFT and a storage capacitor Cst. For convenience of illustration, FIG. 4 illustrates one thin film transistor TFT, and the thin film transistor TFT may correspond to, for example, the driving thin film transistor T1 (see FIG. 2) described above. Although not illustrated in FIG. 4, the switching thin film transistor T2 (see FIG. 2) included in the pixel circuit PC may be electrically connected to the data line DL of the pixel circuit PC.

The thin film transistor TFT may include a semiconductor layer Act, a gate electrode GE, a source electrode SE, and a drain electrode DE.

The semiconductor layer Act may include, for example, polysilicon. As another example, the semiconductor layer Act may include amorphous silicon, may include an oxide semiconductor, or may include an organic semiconductor or the like.

The gate electrode GE may include a low-resistance metal material. The gate electrode GE may include a conductive material including molybdenum (Mo), aluminum (Al), copper (Cu), titanium (Ti), or the like and may include a single layer or multiple layers including the above material.

A gate insulating layer 112 disposed between the semiconductor layer Act and the gate electrode GE may include an inorganic insulating material such as silicon oxide, silicon nitride, silicon oxynitride, aluminum oxide, titanium oxide, tantalum oxide, and hafnium oxide. The gate insulating layer 112 may include a single layer or multiple layers including the above material.

In the present embodiment, a top gate-type transistor in which a gate electrode GE is disposed over a semiconductor layer Act with a gate insulating layer 112 interposed between the gate electrode GE and the semiconductor layer Act is illustrated; however, according to other embodiments, the thin film transistor TFT may be a bottom gate-type transistor.

For example, the source electrode SE and the drain electrode DE may be disposed over the same layer as the data line DL and may include the same material. The source electrode SE, the drain electrode DE, and the data line DL may include a material having high conductivity. The source electrode SE and the drain electrode DE may include a conductive material including molybdenum (Mo), aluminum (Al), copper (Cu), titanium (Ti), or the like and may include a single layer or multiple layers including the above material. In an embodiment, the source electrode SE, the drain electrode DE, and the data line DL may include a multilayer of Ti/Al/Ti.

The storage capacitor Cst may include a lower electrode CE1 and an upper electrode CE2 overlapping each other with a first interlayer insulating layer 113 disposed therebetween. The storage capacitor Cst may overlap the thin film transistor TFT. In this regard, FIG. 4 illustrates that the gate electrode GE of the thin film transistor TFT is the lower electrode CE1 of the storage capacitor Cst. In other embodiments, the storage capacitor Cst may not overlap the thin film transistor TFT. The storage capacitor Cst may be covered by a second interlayer insulating layer 114. The upper electrode CE2 of the storage capacitor Cst may include a conductive material including molybdenum (Mo), aluminum (Al), copper (Cu), titanium (Ti), or the like and may include a single layer or multiple layers including the above material.

The first interlayer insulating layer 113 and the second interlayer insulating layer 114 may include an inorganic insulating material such as silicon oxide, silicon nitride, silicon oxynitride, aluminum oxide, titanium oxide, tantalum oxide, or hafnium oxide. The first interlayer insulating layer 113 and the second interlayer insulating layer 114 may include a single layer or multiple layers including the above material.

The thin film transistor TFT and the storage capacitor Cst may be covered with a first organic insulating layer 115. The first organic insulating layer 115 may include a substantially flat upper surface.

Although not illustrated in FIG. 4, a third interlayer insulating layer (not illustrated) may be further disposed under the first organic insulating layer 115. The third interlayer insulating layer may include an inorganic insulating material such as silicon oxide, silicon nitride, or silicon oxynitride.

A contact metal layer CM may be disposed over the first organic insulating layer 115. The contact metal layer CM may include a high-conductivity material. The contact metal layer CM may include a conductive material including molybdenum (Mo), aluminum (Al), copper (Cu), titanium (Ti), or the like and may include a single layer or multiple layers including the above material. In an embodiment, the contact metal layer CM may include a multilayer of Ti/Al/Ti.

The contact metal layer CM may be disposed between a thin film transistor TFT of the pixel circuit PC and a bridge electrode BE described below and may be electrically connected to each of the thin film transistor TFT and the bridge electrode BE. That is, the bridge electrode BE may be electrically connected to the thin film transistor TFT of the pixel circuit PC through the contact metal layer CM. In some embodiments, the contact metal layer CM may be omitted, and in this case, the bridge electrode BE may be directly connected to the thin film transistor TFT of the pixel circuit PC.

A second organic insulating layer 117 covering the pixel circuit PC may be disposed over the first organic insulating layer 115. The second organic insulating layer 117 may provide a flat upper surface for the light emitting element 200 disposed thereover.

The first organic insulating layer 115 and the second organic insulating layer 117 may include an organic insulating material such as a general-purpose polymer such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any blend thereof. In an embodiment, the first organic insulating layer 115 and the second organic insulating layer 117 may include polyimide.

A pixel electrode 210 of the light emitting element 200 may be disposed over the second organic insulating layer 117. The light emitting element 200 may be an organic light emitting diode OLED and may emit, for example, red, green, or blue light. The light emitting element 200 may include the pixel electrode 210, an intermediate layer 220, and an opposite electrode 230. The pixel electrode 210 may be disposed over the second organic insulating layer 117, and the opposite electrode 230 may be disposed over the pixel electrode 210. The intermediate layer 220 may include an emission layer and may be disposed between the pixel electrode 210 and the opposite electrode 230.

In an embodiment, the pixel electrode 210 may include a lower conductive layer 211 including a transparent conductive oxide, and a reflective layer 212 disposed over the lower conductive layer 211 and including a metal. For example, the lower conductive layer 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). For example, the reflective layer 212 may include silver (Ag), magnesium (Mg), aluminum (Al), platinum (Pt), palladium (Pd), gold (Au), nickel (Ni), neodymium (Nd), iridium (Ir), chromium (Cr), or any compound thereof.

A bridge electrode BE may be disposed over the second organic insulating layer 117 and between the pixel electrode 210 and the intermediate layer 220. The bridge electrode BE may be electrically connected to the pixel circuit PC through a contact hole CH formed in the second organic insulating layer 117. The bridge electrode BE may include a transparent conductive oxide. Accordingly, the reflection of external light from the bridge electrode BE may be prevented. For example, the bridge electrode BE may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

A pixel definition layer 120 may be disposed over the pixel electrode 210 and the bridge electrode BE. The pixel definition layer 120 may define an opening 120OP overlapping a portion (e.g., a center portion) of the pixel electrode 210 and may cover the edge of the pixel electrode 210 and the bridge electrode BE. The opening 120OP of the pixel definition layer 120 may define an emission area of light emitted from the light emitting element 200. For example, the size/width of the opening 120OP may correspond to the size/width of the emission area. Thus, the size and/or width of the pixel PX may depend on the size and/or width of the opening 120OP of the corresponding pixel definition layer 120.

The pixel definition layer 120 may include an organic insulating material. Alternatively, the pixel definition layer 120 may include an inorganic insulating material such as silicon nitride, silicon oxynitride, or silicon oxide. Alternatively, the pixel definition layer 120 may include an organic insulating material and an inorganic insulating material In an embodiment, the pixel definition layer 120 may further include a light blocking material. For example, the light blocking material may include a metal material such as chromium (Cr) or molybdenum (Mo) and an oxide thereof or may include an organic material mixed with black ink, pigment, and/or dye. Accordingly, a portion of the external light incident on the display apparatus 1 may be absorbed by the pixel definition layer 120 and thus the external light reflectance may be reduced.

The intermediate layer 220 may be disposed over the bridge electrode BE. For example, the intermediate layer 220 may be disposed in the opening 120OP of the pixel definition layer 120. The intermediate layer 220 may include an emission layer and may include a high-molecular or low-molecular weight organic material for emitting light of a certain color. For example, the emission layer may emit red light, green light, or blue light.

In some embodiments, the intermediate layer 220 may include a first common layer (not illustrated) and/or a second common layer (not illustrated) respectively disposed over and/or under the emission layer. Each of the first and second common layers may include a single layer or multiple layers. For example, when the first common layer is formed of a high-molecular weight material, the first common layer may include a hole transport layer (HTL) having a single-layer structure and may be formed of poly-(3,4)-ethylene-dihydroxy thiophene (PEDOT) or polyaniline (PANI). When the first common layer is formed of a low-molecular weight material, the first common layer may include a multilayer structure of a hole injection layer (HIL) and a hole transport layer (HTL). The second common layer may include an electron transport layer (ETL) and/or an electron injection layer (EIL).

The opposite electrode 230 may be disposed over the intermediate layer 220. The opposite electrode 230 may include a conductive material having a low work function. For example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 230 may further include a layer such as ITO, IZO, ZnO, or $In_2O_3$ over the (semi)transparent layer including the above material.

The opposite electrode 230 may be integrally formed over a plurality of pixel electrodes 210. The opposite electrode 230 may cover the display area DA (see FIG. 1). In addition, the opposite electrode 230 may also be disposed in a portion of the peripheral area PA (see FIG. 1).

According to an embodiment, the light emitting element 200 may be electrically connected to the pixel circuit PC through the bridge electrode BE. For example, the pixel electrode 210 of the light emitting element 200 may be electrically connected to the bridge electrode BE, and the bridge electrode BE may be electrically connected to the pixel circuit PC through the contact hole CH formed in the second organic insulating layer 117.

In an embodiment, the pixel electrode 210 may not overlap the contact hole CH of the second organic insulating layer 117 in the plan view. On the other hand, the bridge electrode BE may overlap the contact hole CH of the second organic insulating layer 117 in the plan view. Also, at least a portion of the bridge electrode BE may overlap the opening 120OP of the pixel definition layer 120 in the plan view.

In an embodiment, at least a portion of the bridge electrode BE may be disposed over the pixel electrode 210. For example, at least a portion of the bridge electrode BE may directly contact the upper surface of the pixel electrode 210, that is, the upper surface of the reflective layer 212. In this case, at least a portion of the bridge electrode BE may be disposed between the pixel electrode 210 and the intermediate layer 220.

As a comparative example, the pixel electrode 210 including the reflective layer 212 may be disposed to overlap the opening 120OP of the pixel definition layer 120 to form the pixel PX and may extend to overlap the contact hole CH formed in the second organic insulating layer 117 under the pixel electrode 210, for electrical connection to the pixel circuit PC. In this case, the area of the pixel electrode 210 in the plan view may relatively increase, which may cause an increase in the external light reflectance. For example, the external light reflected from the pixel electrode 210 may be visually recognized by the user after passing through a color filter CF disposed thereover, and the user may visually recognize the reflected light as light of a particular color. When the external light reflectance increases, the problem that the user visually recognizes the reflected light of a particular color may become more severe.

However, according to an embodiment, the pixel electrode 210 may overlap the opening 120OP of the pixel definition layer 120 but may not overlap the contact hole CH of the second organic insulating layer 117. Instead, the bridge electrode BE may electrically connect the pixel electrode 210 to the pixel circuit PC. That is, the bridge electrode BE including a transparent conductive oxide may be electrically connected to the pixel electrode 210 and may also be electrically connected to the pixel circuit PC through the contact hole CH of the second organic insulating layer 117. Accordingly, the area of the pixel electrode 210 may be minimized and the bridge electrode BE may not substantially contribute to the reflection of external light and thus the external light reflectance of the display apparatus 1 may be minimized.

Moreover, although not illustrated in FIG. 4, a step may occur on the upper surface of the pixel definition layer 120 due to the contact hole CH of the second organic insulating layer 117. That is, an uneven portion may be formed on the upper surface of the pixel definition layer 120 at a position corresponding to the contact hole CH of the second organic insulating layer 117, or the pixel definition layer 120 may not be formed to a sufficient thickness in an area of the contact hole CH. The uneven portion and the insufficient thickness of the pixel definition layer 120 may increase the external light reflectance. Thus, the pixel electrode 210 according to an embodiment may be disposed not to overlap the contact hole CH, thereby preventing an increase in the external light reflectance in an area of the contact hole CH.

Moreover, an encapsulation layer 300 may be disposed over the light emitting element 200. Because the light emitting element 200 may be easily damaged by external moisture or oxygen, the light emitting element 200 may be covered and protected by the encapsulation layer 300. The encapsulation layer 300 may cover the display area DA (see FIG. 1) and the peripheral area PA surrounding the display area DA. The encapsulation layer 300 may include at least one organic layer and at least one inorganic layer. For example, the encapsulation layer 300 may include a first inorganic encapsulation layer 310, an organic encapsulation layer 320, and a second inorganic encapsulation layer 330.

The first inorganic encapsulation layer 310 may cover the opposite electrode 230 and may include one or more inorganic materials among aluminum oxide, titanium oxide, tantalum oxide, hafnium oxide, zinc oxide, silicon oxide, silicon nitride, and silicon oxynitride. Although not illustrated, other layers such as a capping layer may be disposed between the first inorganic encapsulation layer 310 and the opposite electrode 230 when necessary.

The organic encapsulation layer 320 may cover the first inorganic encapsulation layer 310 and may have a substantially flat upper surface. Particularly, the upper surface of the organic encapsulation layer 320 may be substantially flat in the display area DA. The organic encapsulation layer 320 may include a polymer-based material. The polymer-based material may include acryl-based resin, epoxy-based resin, polyimide, polyethylene, or the like. In an embodiment, the organic encapsulation layer 320 may include acrylate. The organic encapsulation layer 320 may be formed by curing a monomer or applying a polymer. The organic encapsulation layer 320 may have transparency.

The second inorganic encapsulation layer 330 may cover the organic encapsulation layer 320 and may include one or more inorganic materials among aluminum oxide, titanium oxide, tantalum oxide, hafnium oxide, zinc oxide, silicon oxide, silicon nitride, and silicon oxynitride.

Although the encapsulation layer 300 may crack through the above multilayer structure, the crack may not be connected between the first inorganic encapsulation layer 310 and the organic encapsulation layer 320 or between the organic encapsulation layer 320 and the second inorganic encapsulation layer 330. Accordingly, the formation of a path through which external moisture or oxygen penetrates into the light emitting element 200 in the display area DA may be prevented or minimized.

According to an embodiment, a black matrix BM and a color filter CF may be disposed over the encapsulation layer 300. The black matrix BM may absorb or block the light incident from the outside, and the color filter CF may selectively transmit the light emitted from the intermediate layer 220 depending on the wavelength band (i.e., the color of light).

The black matrix BM may include a hole BM-H overlapping the opening 120OP of the pixel definition layer 120, and the light emitted from the light emitting element 200 may be output to the outside through the hole BM-H. The hole BM-H may be filled by the color filter CF.

The black matrix BM may include a light blocking material and, for example, may include a metal material such as chromium (Cr) or molybdenum (Mo) and an oxide thereof or may include an organic material mixed with black ink, pigment, and/or dye.

As such, when the black matrix BM is disposed over the encapsulation layer 300, the reflection of external light may be sufficiently prevented even without a polarization layer having a relatively great thickness and thus the flexibility thereof may be improved and the thickness of the display apparatus 1 may be reduced. Also, because the black matrix BM has a higher transmittance than the polarization layer, the contrast and light efficiency thereof may be improved.

The color filter CF may include a coloring material and an organic material in which a coloring material is dispersed, wherein the coloring material may include a general pigment or dye and the organic material may include a general dispersant. For example, when visible light having a certain color, for example, red, green, and blue light, is emitted from the light emitting element 200, the color filter CF may improve the optical characteristics (e.g., the color purity) of the visible light. As another example, when white light is emitted from the light emitting element 200, the color filter CF may selectively transmit only light of a certain wavelength band and absorb light of the remaining wavelength band, thereby allowing each pixel PX to emit one of red light, green light, and blue light.

Moreover, although not illustrated, a touch sensing layer may be disposed between the encapsulation layer 300 and the black matrix BM. For example, the touch sensing layer may be formed directly over the encapsulation layer 300, and in this case, an adhesive layer may not be disposed between the touch sensing layer and the encapsulation layer 300. The touch sensing layer may be configured to obtain coordinate information according to an external input, for example, a touch event. The touch sensing layer may include, for example, a sensing electrode and signal lines connected to the sensing electrode. The touch sensing layer may be configured to sense an external input by a mutual cap method or a self-cap method.

Also, although not illustrated, a protection layer (not illustrated) including an organic insulating material, may be disposed over the black matrix BM and the color filter CF, and a cover window (not illustrated) may be disposed over the protection layer. The protection layer and the cover window may protect the light emitting element 200 from external impact. In an embodiment, the cover window may include glass or plastic and may include, for example, ultra-thin tempered glass of which strength is reinforced by a method such as chemical strengthening or thermal strengthening.

Figure 5:
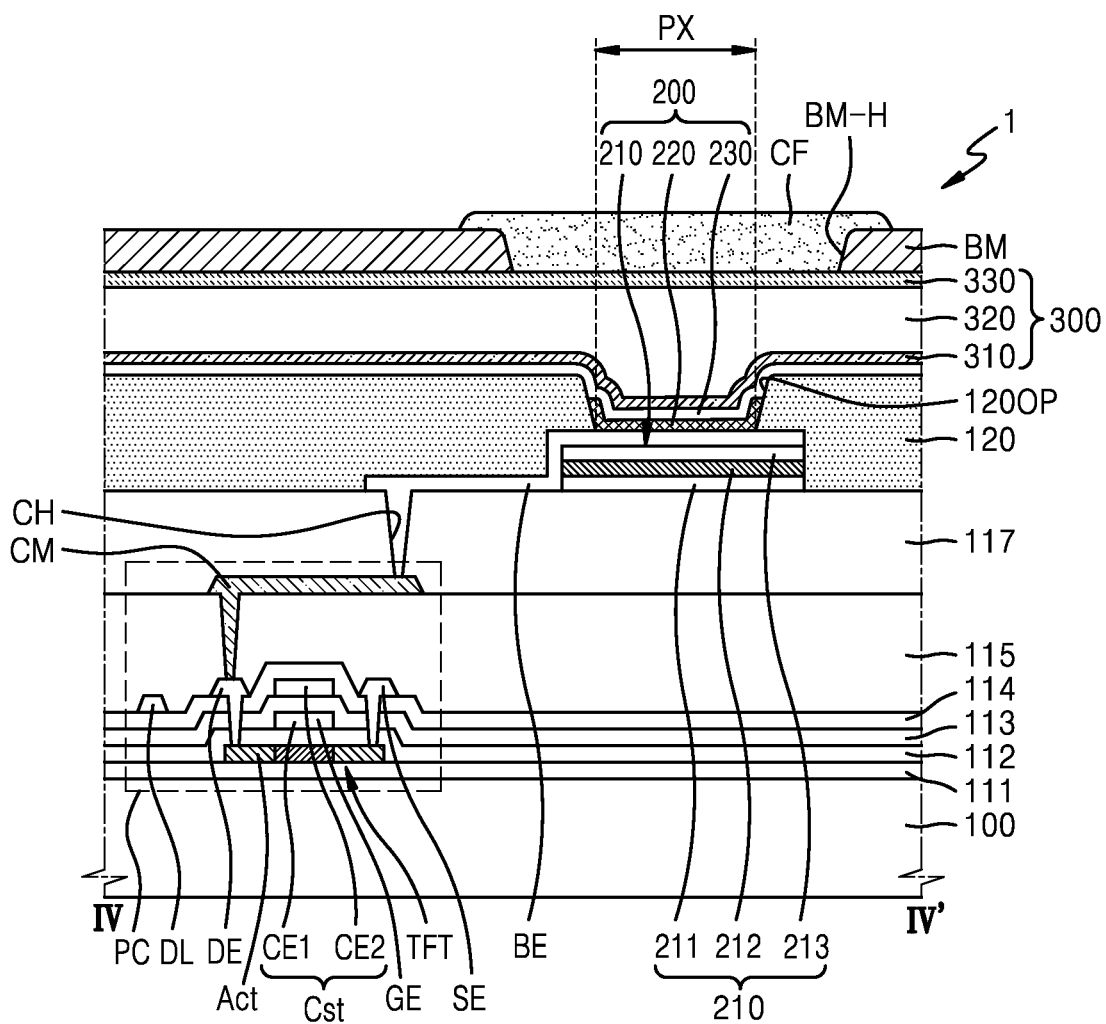
FIG. 5 is a cross-sectional view schematically illustrating a portion of a display apparatus according to other embodiments.

FIG. 5 is a cross-sectional view schematically illustrating a portion of a display apparatus according to other embodiments. Descriptions of the same or substantially the same components as those described above with reference to FIG. 4 will be omitted, and differences therebetween will be mainly described below.

Referring to FIG. 5, the pixel electrode 210 may further include an upper conductive layer 213 disposed over the reflective layer 212. In an embodiment, the upper conductive layer 213 may include a transparent conductive oxide. For example, the upper conductive layer 213 may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO).

That is, the pixel electrode 210 may include a lower conductive layer 211, a reflective layer 212 disposed over the lower conductive layer 211, and an upper conductive layer 213 disposed over the reflective layer 212. In this case, at least a portion of the bridge electrode BE may contact the upper surface of the upper conductive layer 213 of the pixel electrode 210. When the bridge electrode BE is patterned, the upper conductive layer 213 may protect the reflective layer 212 of the pixel electrode 210, thus preventing the reflective layer 212 from being oxidized or damaged.

Figure 6:
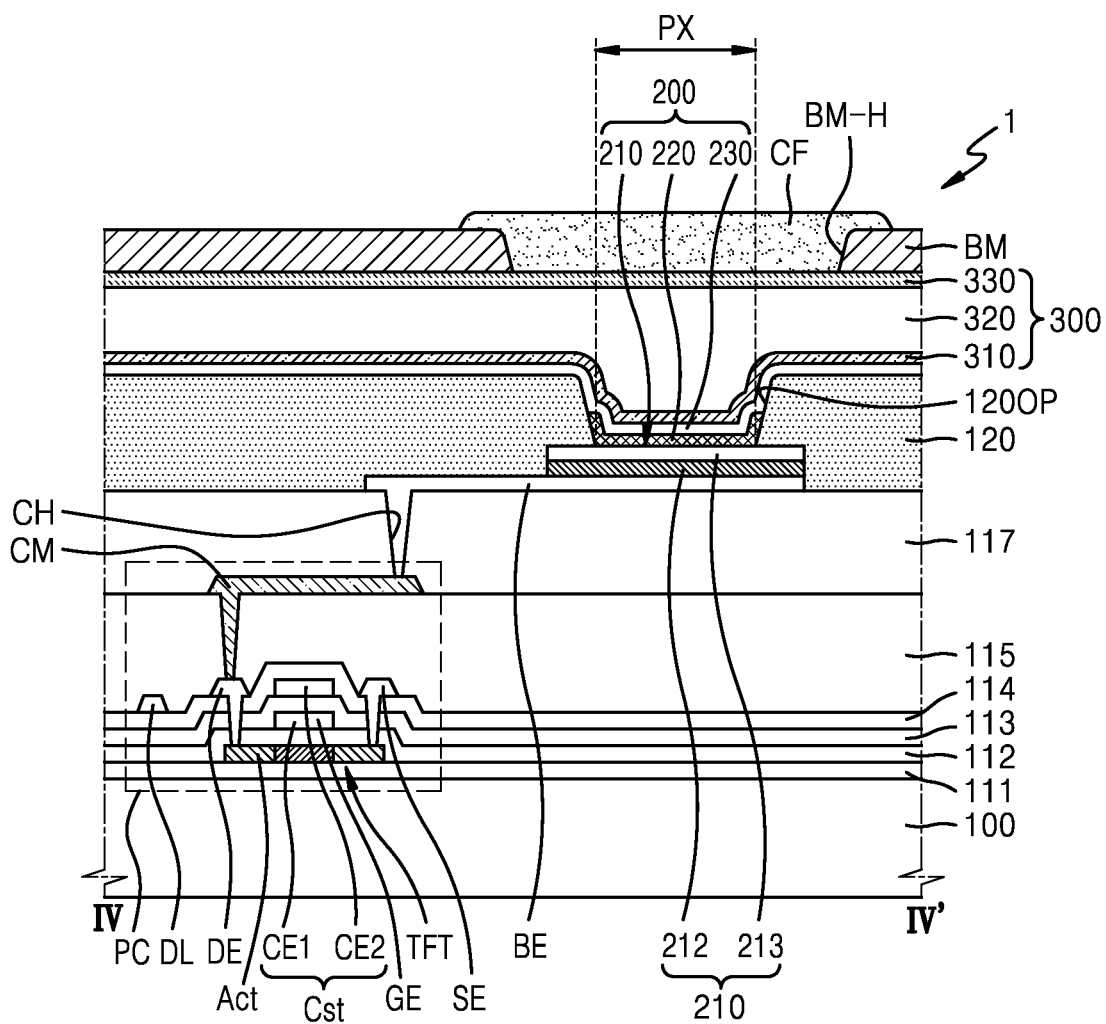
FIG. 6 is a cross-sectional view schematically illustrating a portion of a display apparatus according to other embodiments.

FIG. 6 is a cross-sectional view schematically illustrating a portion of a display apparatus according to other embodiments. Descriptions of the same or substantially the same components as those described above with reference to FIG. 4 will be omitted, and differences therebetween will be mainly described below.

Referring to FIG. 6, the pixel electrode 210 may include a reflective layer 212 including a metal and an upper conductive layer 213 disposed over the reflective layer 212 and including a transparent conductive oxide. As described above, the reflective layer 212 of the pixel electrode 210 may include silver (Ag), magnesium (Mg), aluminum (Al), platinum (Pt), palladium (Pd), gold (Au), nickel (Ni), neodymium (Nd), iridium (Ir), chromium (Cr), or any compound thereof. In an embodiment, the upper conductive layer 213 of the pixel electrode 210 may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO).

In an embodiment, the pixel electrode 210 may be disposed over the bridge electrode BE. That is, the bridge electrode BE may be disposed under the pixel electrode 210 and, for example, at least a portion of the bridge electrode BE may be disposed between the second organic insulating layer 117 and the pixel electrode 210. In an embodiment, at least a portion of the bridge electrode BE may contact the lower surface of the pixel electrode 210, for example, the lower surface of the reflective layer 212.

Figure 7:
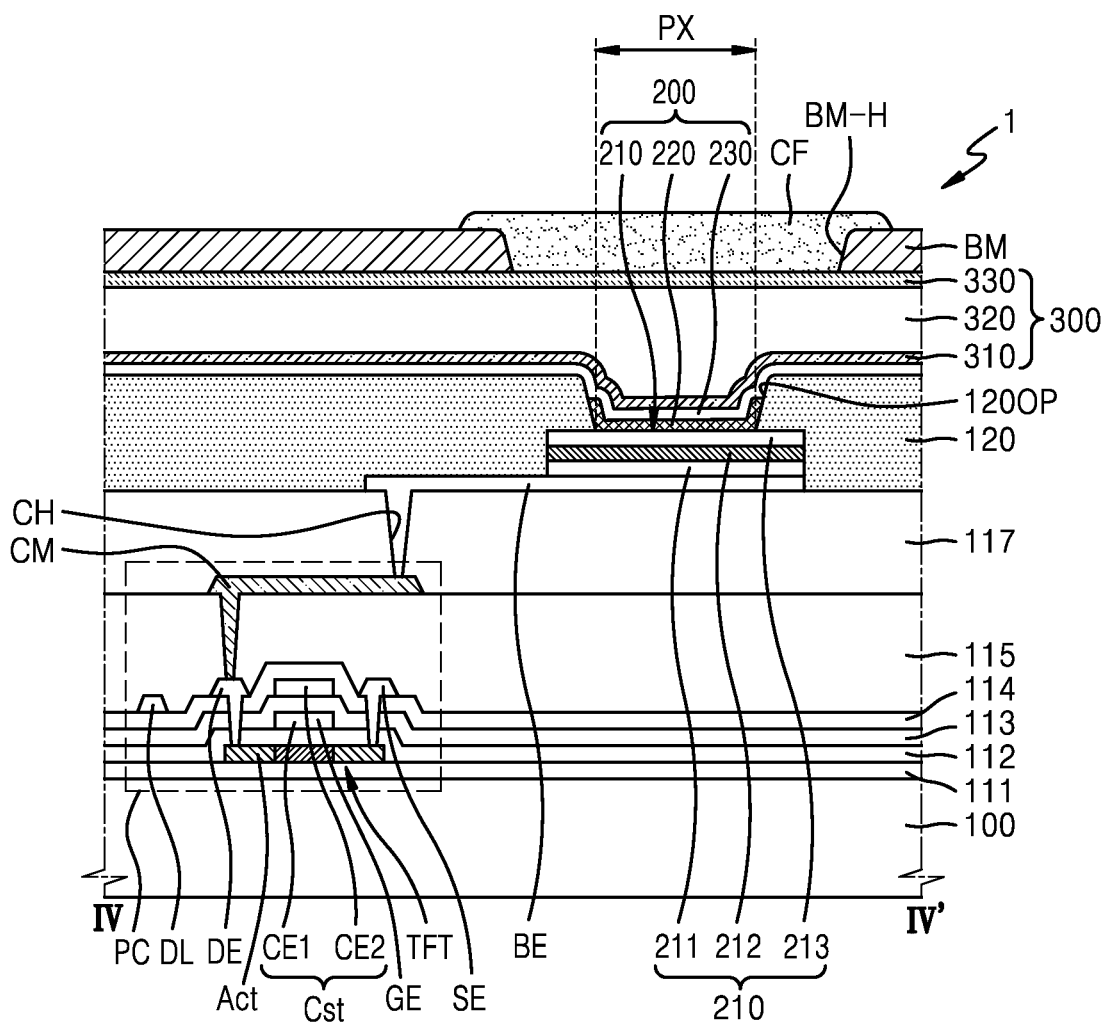
FIG. 7 is a cross-sectional view schematically illustrating a portion of a display apparatus according to other embodiments.

FIG. 7 is a cross-sectional view schematically illustrating a portion of a display apparatus according to other embodiments. Descriptions of the same or substantially the same components as those described above with reference to FIGS. 4 and 6 will be omitted, and differences therebetween will be mainly described below.

Referring to FIG. 7, the pixel electrode 210 may include a lower conductive layer 211 including a transparent conductive oxide, a reflective layer 212 disposed over the lower conductive layer 211 and including a metal, and an upper conductive layer 213 disposed over the reflective layer 212 and including a transparent conductive oxide.

In an embodiment, each of the lower conductive layer 211 and the upper conductive layer 213 of the pixel electrode 210 may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO) as described above.

Also, the reflective layer 212 of the pixel electrode 210 may include silver (Ag), magnesium (Mg), aluminum (Al), platinum (Pt), palladium (Pd), gold (Au), nickel (Ni), neodymium (Nd), iridium (Ir), chromium (Cr), or any compound thereof as described above.

In this case, at least a portion of the bridge electrode BE disposed between the second organic insulating layer 117 and the pixel electrode 210 may contact the lower surface of the pixel electrode 210, for example, the lower surface of the lower conductive layer 211.

Figure 8:
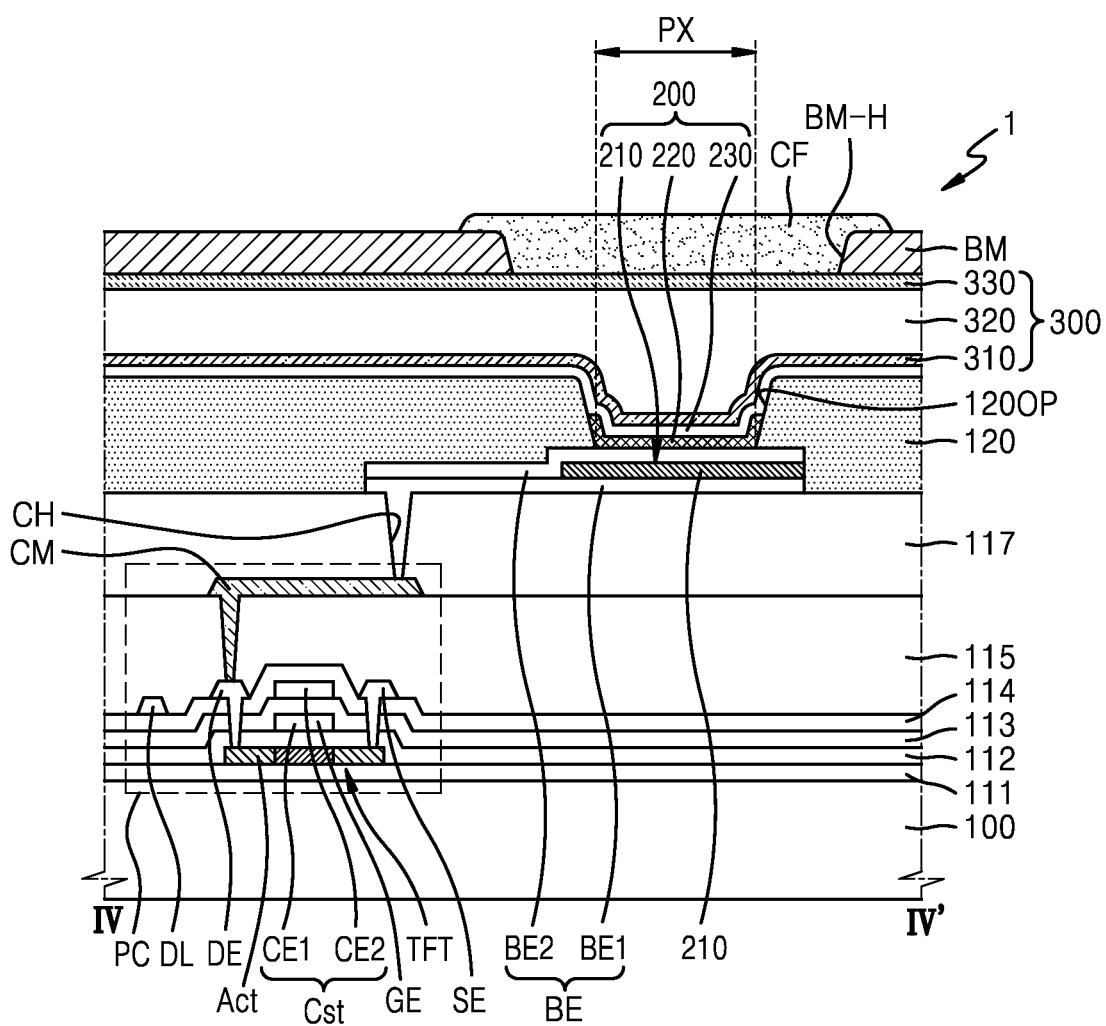
FIG. 8 is a cross-sectional view schematically illustrating a portion of a display apparatus according to other embodiments.

FIG. 8 is a cross-sectional view schematically illustrating a portion of a display apparatus according to other embodiments. Descriptions of the same or substantially the same components as those described above with reference to FIG. 4 will be omitted, and differences therebetween will be mainly described below.

Referring to FIG. 8, the bridge electrode BE may have a multilayer structure. For example, the bridge electrode BE may include a first bridge electrode layer BE1 over the second organic insulating layer 117 and a second bridge electrode layer BE2 disposed over the first bridge electrode layer BE1.

In an embodiment, each of the first bridge electrode layer BE1 and the second bridge electrode layer BE2 may include a transparent conductive oxide. For example, each of the first bridge electrode layer BE1 and the second bridge electrode layer BE2 may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO).

In an embodiment, the pixel electrode 210 may be disposed between the first bridge electrode layer BE1 and the second bridge electrode layer BE2 of the bridge electrode BE. That is, the first bridge electrode layer BE1 may be disposed between the second organic insulating layer 117 and the pixel electrode 210, and the second bridge electrode layer BE2 may be disposed over the pixel electrode 210. For example, the first bridge electrode layer BE1 and the second bridge electrode layer BE2 may respectively contact the lower surface and the upper surface of the pixel electrode 210.

In an embodiment, the pixel electrode 210 may have a single-layer structure and the pixel electrode 210 may include, for example, a reflective layer including a metal. In this case, the first bridge electrode layer BE1 may contact the lower surface of the reflective layer of the pixel electrode 210.

Figure 9:
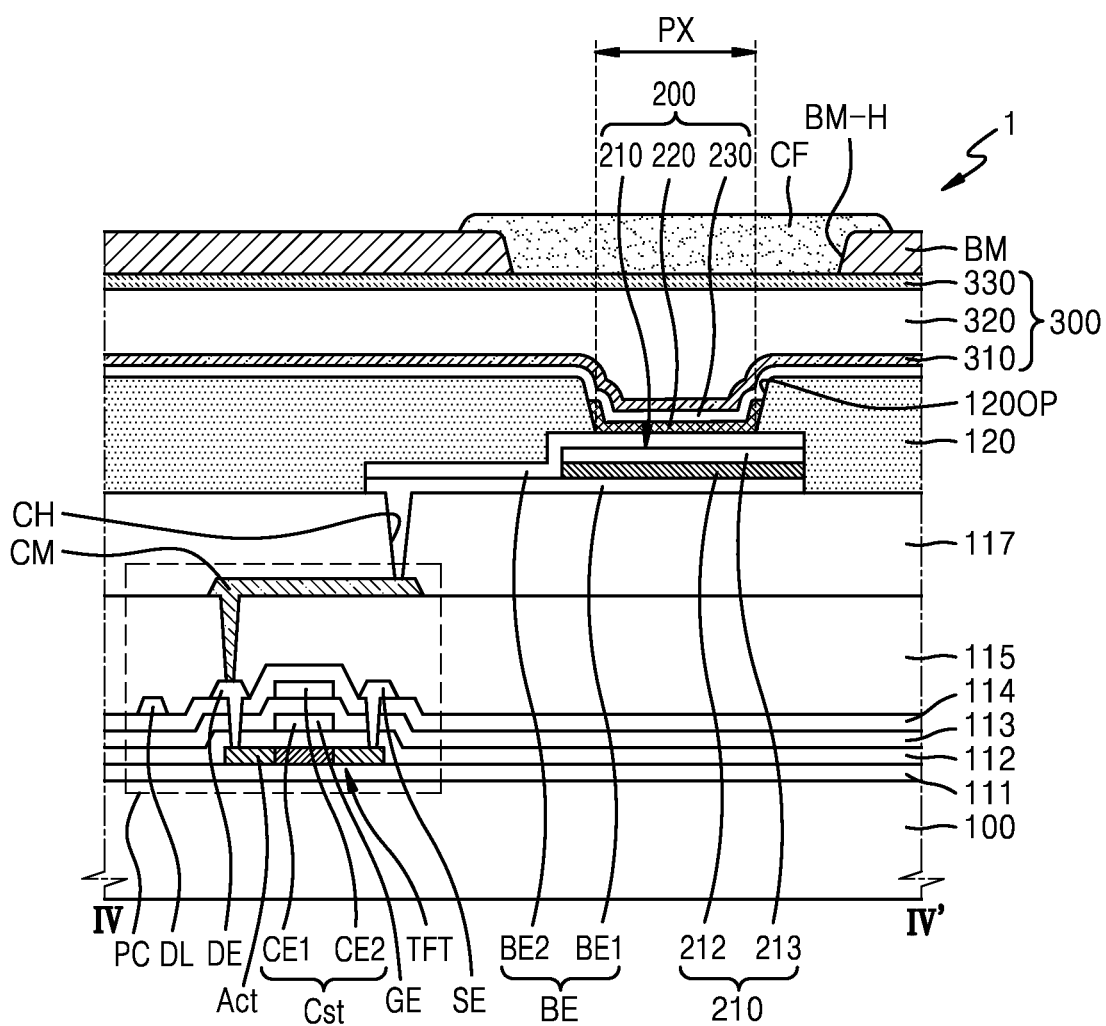
FIG. 9 is a cross-sectional view schematically illustrating a portion of a display apparatus according to other embodiments.

FIG. 9 is a cross-sectional view schematically illustrating a portion of a display apparatus according to other embodiments. Descriptions of the same or substantially the same components as those described above with reference to FIGS. 4 and 8 will be omitted, and differences therebetween will be mainly described below.

Referring to FIG. 9, the pixel electrode 210 may have a multilayer structure and may include, for example, a reflective layer 212 and a conductive layer disposed over and/or under the reflective layer 212. In an embodiment, as illustrated in FIG. 9, the pixel electrode 210 may include a reflective layer 212 including a metal and an upper conductive layer 213 disposed over the reflective layer 212 and including a transparent conductive oxide. In this case, the second bridge electrode layer BE2 of the bridge electrode BE may directly contact the upper surface of the upper conductive layer 213 of the pixel electrode 210. Accordingly, when the first bridge electrode layer BE1 is patterned, the upper conductive layer 213 may protect the reflective layer 212 of the pixel electrode 210, thus preventing the reflective layer 212 from being oxidized or damaged.

Moreover, although not illustrated in FIG. 9, a lower conductive layer (not illustrated) including a transparent conductive oxide may be further disposed under the reflective layer 212 of the pixel electrode 210.

FIGS. 10A to 10J are cross-sectional views schematically illustrating operations of a method of manufacturing a display apparatus according to an embodiment. The display apparatus manufactured according to the present manufacturing method may correspond to the display apparatus of FIG. 4, like reference numerals will denote like elements, and thus redundant descriptions thereof will be omitted for conciseness.

Figure 10A:
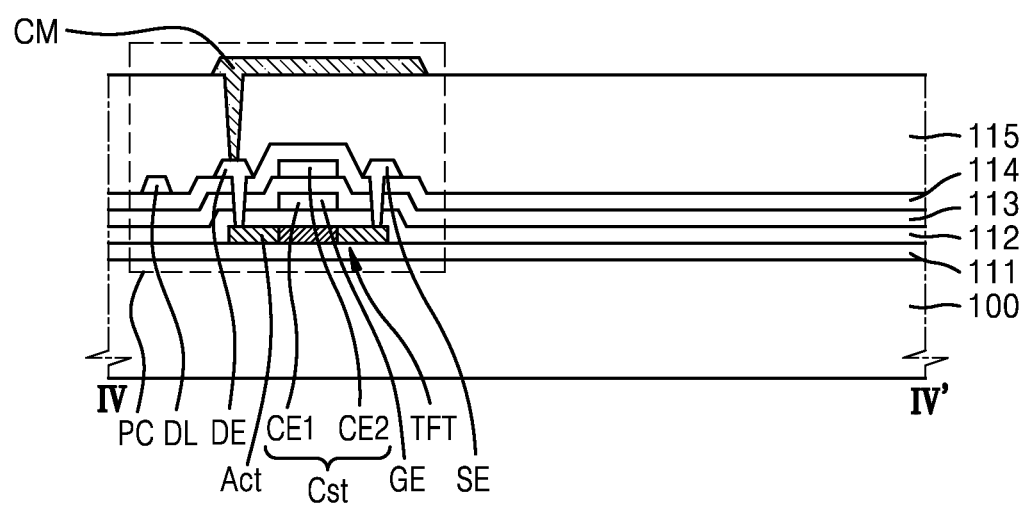
FIGS. 10A, 10B, 10C, 10D, 10E, 10F, 10G, 10H, 10I and 10J are cross-sectional views schematically illustrating operations of a method of manufacturing a display apparatus according to an embodiment.

Referring to FIG. 10A, a pixel circuit PC including a thin film transistor TFT and a storage capacitor Cst may be formed over a substrate 100. In order to form the pixel circuit PC, various insulating layers, semiconductor layers, and electrode layers may be formed over the substrate 100. For example, various material layers may be formed through a coating process or a deposition process and then the various material layers may be patterned through a photolithography process to form the various insulating layers, semiconductor layers, and electrode layers.

Here, for example, a method such as spin coating may be used in the coating process, and chemical vapor deposition (CVD) such as thermal chemical vapor deposition (TCVD), plasma enhanced chemical vapor deposition (PECVD), or atmospheric pressure chemical vapor deposition (APCVD), or physical vapor deposition (PVD) such as thermal evaporation, sputtering, or e-beam evaporation may be used in the deposition process.

FIG. 10A illustrates a state in which a buffer layer 111 has been formed over the substrate 100 and a contact metal layer CM has been formed over a first organic insulating layer 115.

Figure 10B:
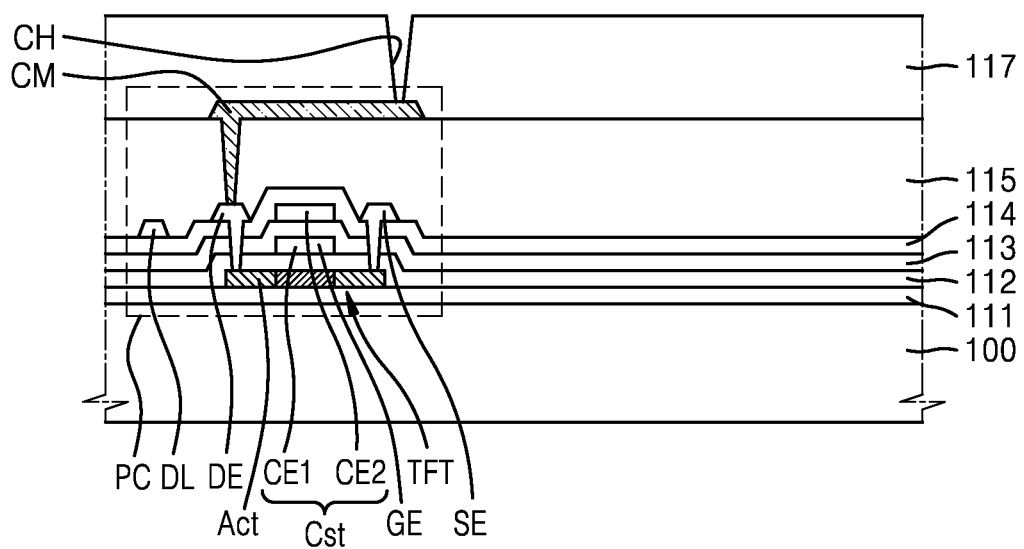

Referring to FIG. 10B, a second organic insulating layer 117 covering the pixel circuit PC and including at least one contact hole CH may be formed. For example, a second organic insulating layer material layer may be formed over the first organic insulating layer 115 through a coating process or a deposition process and then the second organic insulating layer material layer may be patterned through a photolithography process to form the second organic insulating layer 117 including at least one contact hole CH.

Figure 10C:
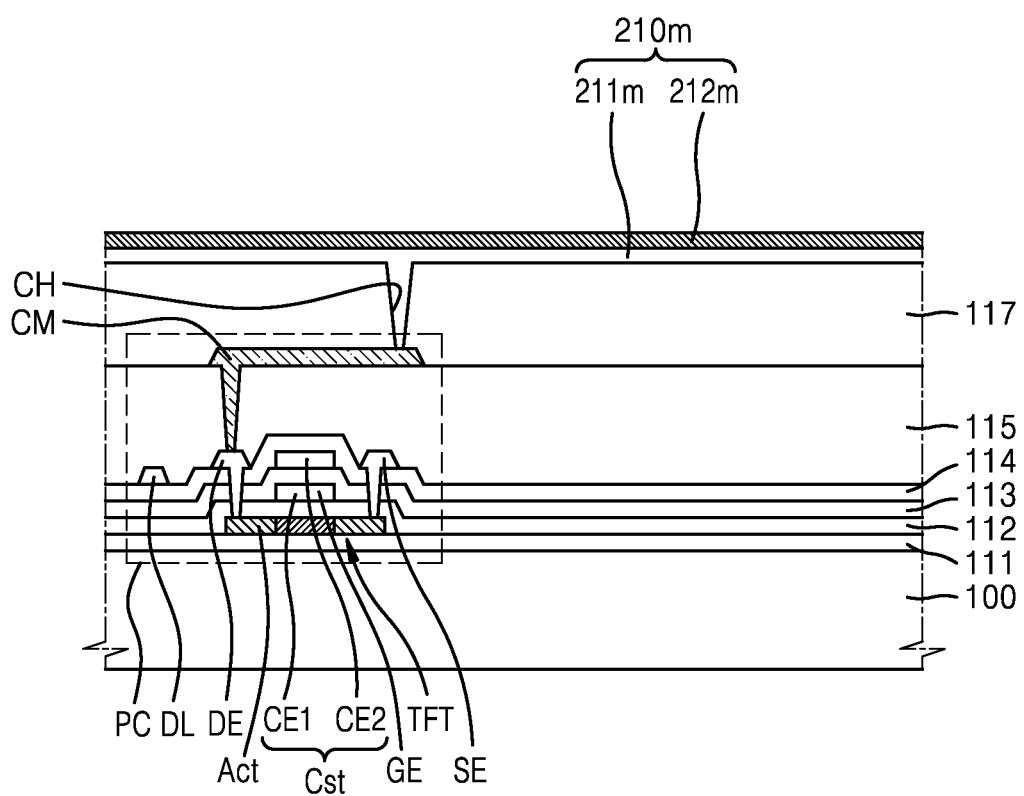
Figure 10D:
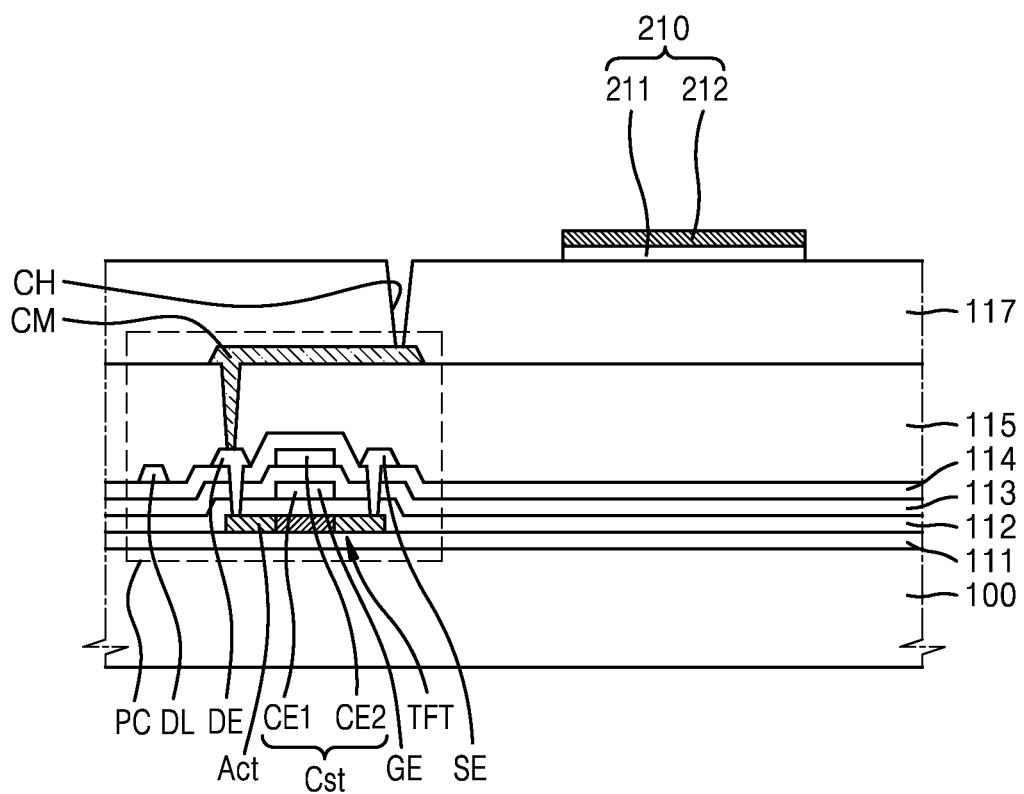

Referring to FIGS. 10C and 10D, a pixel electrode 210 disposed over the second organic insulating layer 117 may be formed. For this purpose, first, as illustrated in FIG. 10C, a pixel electrode material layer 210m may be formed over the second organic insulating layer 117. In an embodiment, the pixel electrode material layer 210m may include a lower conductive layer material layer 211m and a reflective layer material layer 212m. The pixel electrode material layer 210m may be formed through, for example, a coating process using spin coating or the like or a deposition process using physical vapor deposition (PVD) such as sputtering or e-beam evaporation.

Next, as illustrated in FIG. 10D, the pixel electrode material layer 210m may be patterned to form the pixel electrode 210, wherein the pixel electrode material layer 210m may be patterned such that the pixel electrode 210 may not overlap the contact hole CH of the second organic insulating layer 117 in the plan view. For example, the patterning may be performed through a photolithography process.

For example, the lower conductive layer material layer 211*m* and the reflective layer material layer 212*m* of the pixel electrode material layer 210*m* may be patterned together by the same process. The lower conductive layer material layer 211*m* may be patterned to form a lower conductive layer 211 and the reflective layer material layer 212*m* may be patterned to form a reflective layer 212 and thus the pixel electrode 210 including the lower conductive layer 211 and the reflective layer 212 may be formed. In an embodiment, the lower conductive layer 211 may include a transparent conductive oxide and the reflective layer 212 may include a metal as described above.

Figure 10E:
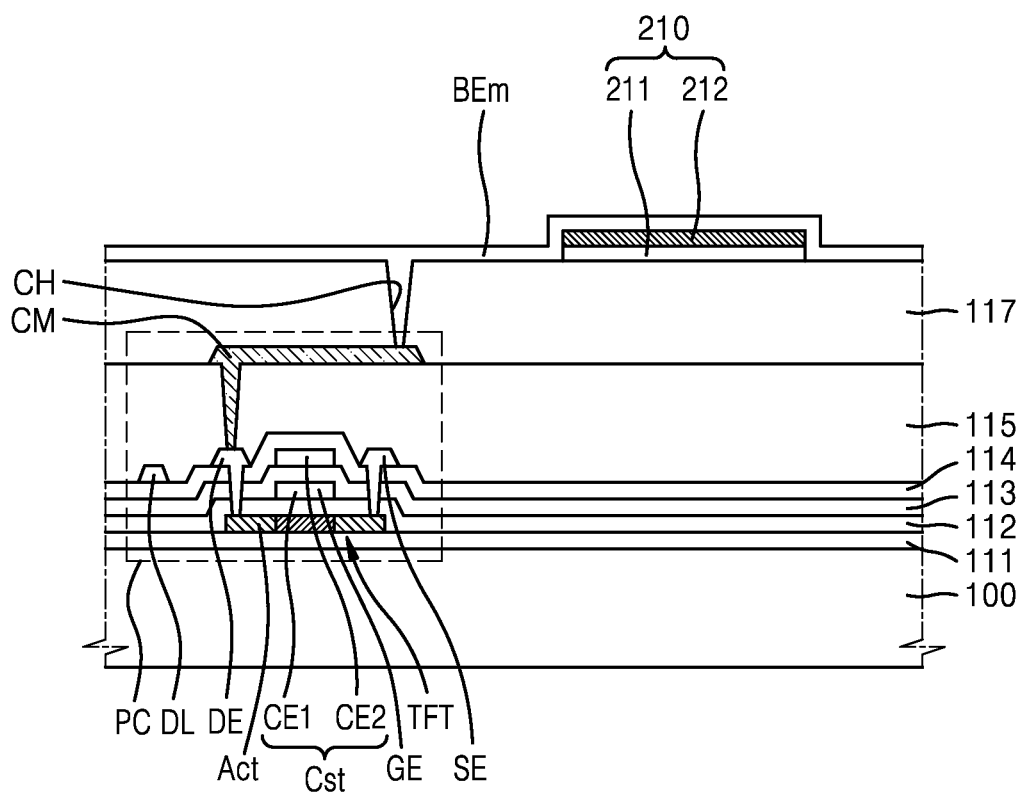
Figure 10F:
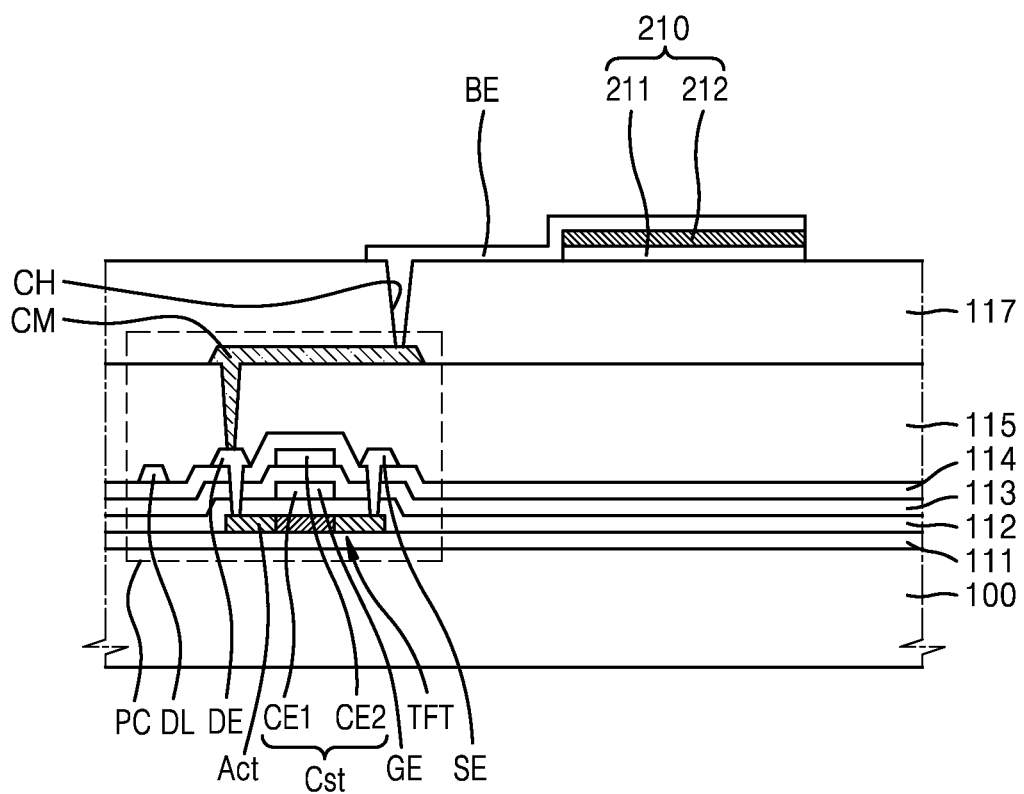

Referring to FIGS. 10E and 10F, a bridge electrode BE disposed over the second organic insulating layer 117 and electrically connected to the pixel circuit PC through at least one contact hole CH of the second organic insulating layer 117 may be formed. For this purpose, first, as illustrated in FIG. 10E, a bridge electrode material layer BEm may be formed over the second organic insulating layer 117. The bridge electrode material layer BEm may be formed through, for example, a coating process using spin coating or the like or a deposition process using physical vapor deposition (PVD) such as sputtering or e-beam evaporation.

Next, as illustrated in FIG. 10F, the bridge electrode material layer BEm may be patterned to form the bridge electrode BE, wherein the bridge electrode material layer BEm may be patterned such that at least a portion of the bridge electrode BE may overlap the opening 120OP (see FIG. 4) of the pixel definition layer 120 (see FIG. 4) in the plan view. Also, the bridge electrode BE may be patterned to overlap the contact hole CH of the second organic insulating layer 117 such that the bridge electrode BE may be connected to the pixel circuit PC through the contact hole CH. The patterning may be performed through a photolithography process. The bridge electrode BE formed as such may directly contact the upper surface of the pixel electrode 210 and therefore may be electrically connected to the pixel electrode 210. In an embodiment, the bridge electrode BE may include a transparent conductive oxide as described above.

Figure 10G:
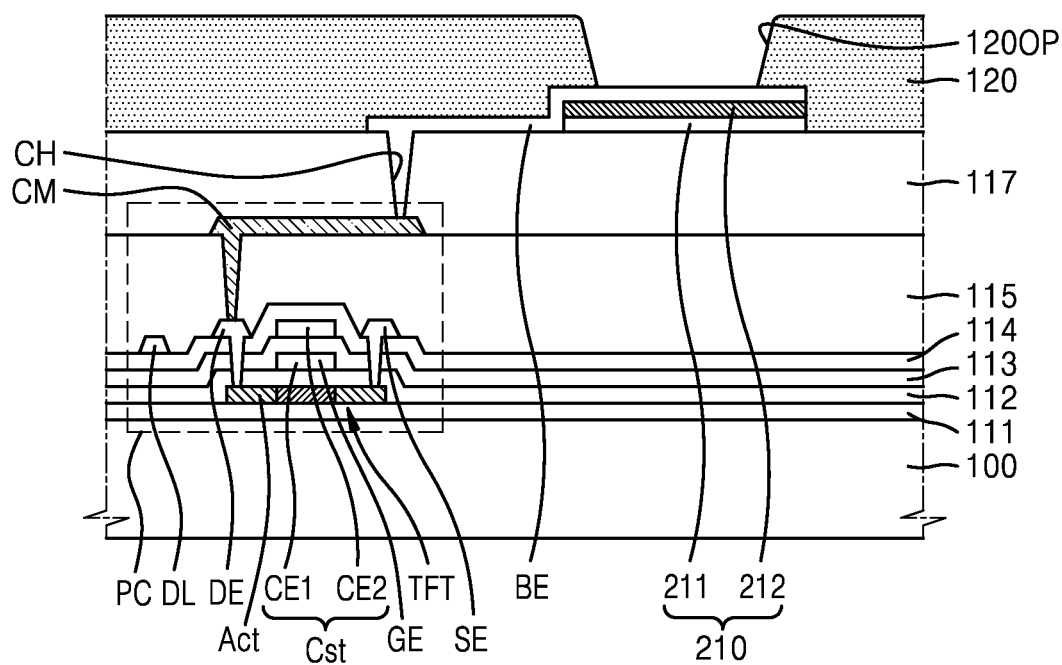

Referring to FIG. 10G, a pixel definition layer 120 disposed over the pixel electrode 210 and defining an opening 120OP overlapping a portion of the pixel electrode 210 may be formed. For example, a pixel definition layer material layer may be formed through the above coating process or deposition process and then the pixel definition layer material layer may be patterned through a photolithography process to form the pixel definition layer 120 including the opening 120OP.

Figure 10H:
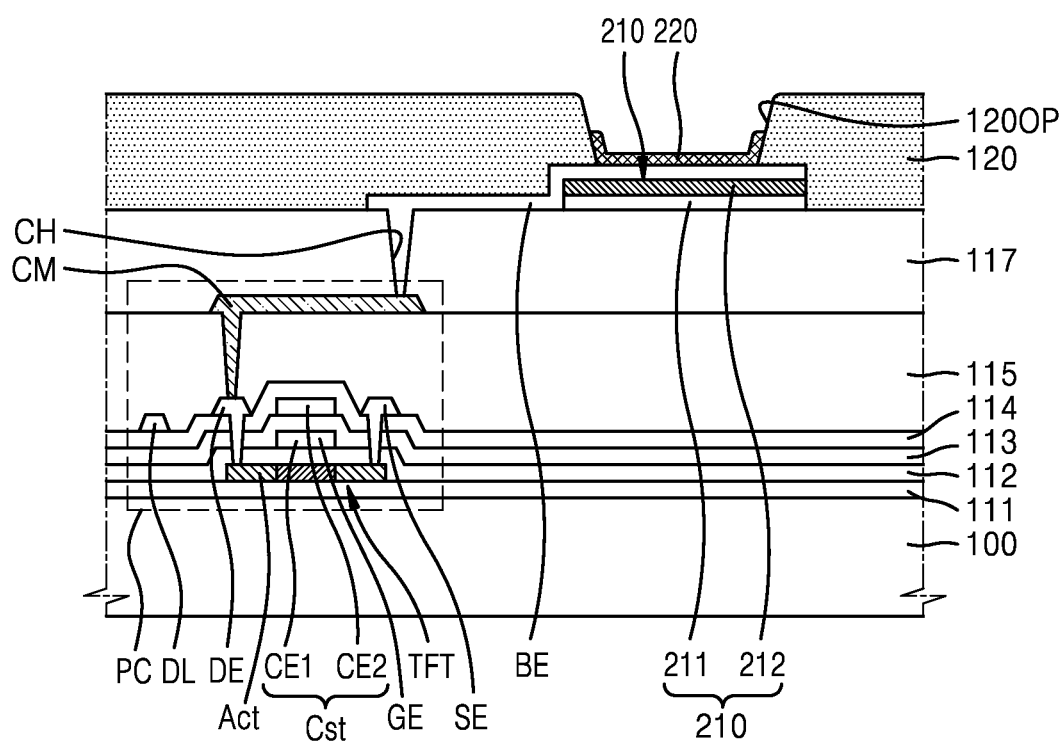

Referring to FIG. 10H, an intermediate layer 220 may be formed over the pixel electrode 210 and the bridge electrode BE. For example, the intermediate layer 220 may be formed in the opening 120OP of the pixel definition layer 120. The intermediate layer 220 may be formed by a deposition process, a printing process, or the like, and in this case, a fine metal mask (FMM) may be used. For example, the intermediate layer 220 may be formed by a deposition process using CVD such as thermal chemical vapor deposition (TCVD), plasma enhanced chemical vapor deposition (PECVD), or atmospheric pressure chemical vapor deposition (APCVD), or an inkjet printing process.

Figure 10I:
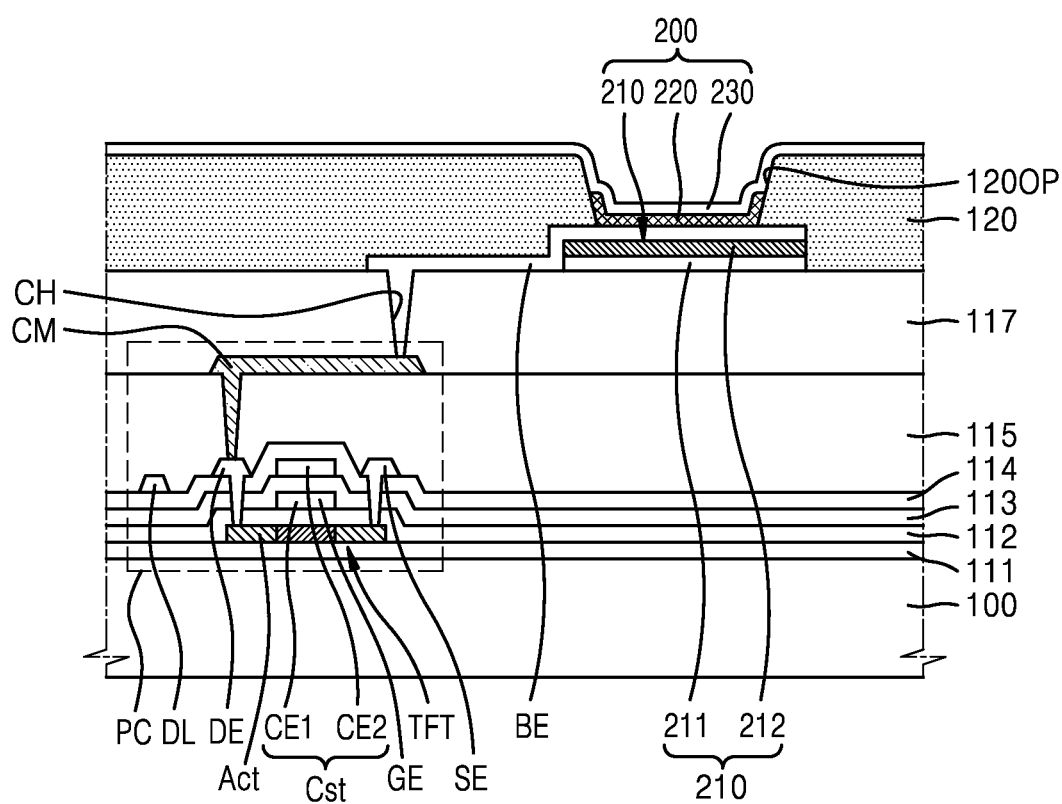

Referring to FIG. 10I, an opposite electrode 230 may be formed over the intermediate layer 220. For example, the opposite electrode 230 may be formed to cover the intermediate layer 220 and the pixel definition layer 120. The opposite electrode 230 may be entirely formed over the display area DA (see FIG. 1). The opposite electrode 230 may be formed through, for example, a coating process using spin coating or the like or a deposition process using physical vapor deposition (PVD) such as sputtering or e-beam evaporation.

Figure 10J:
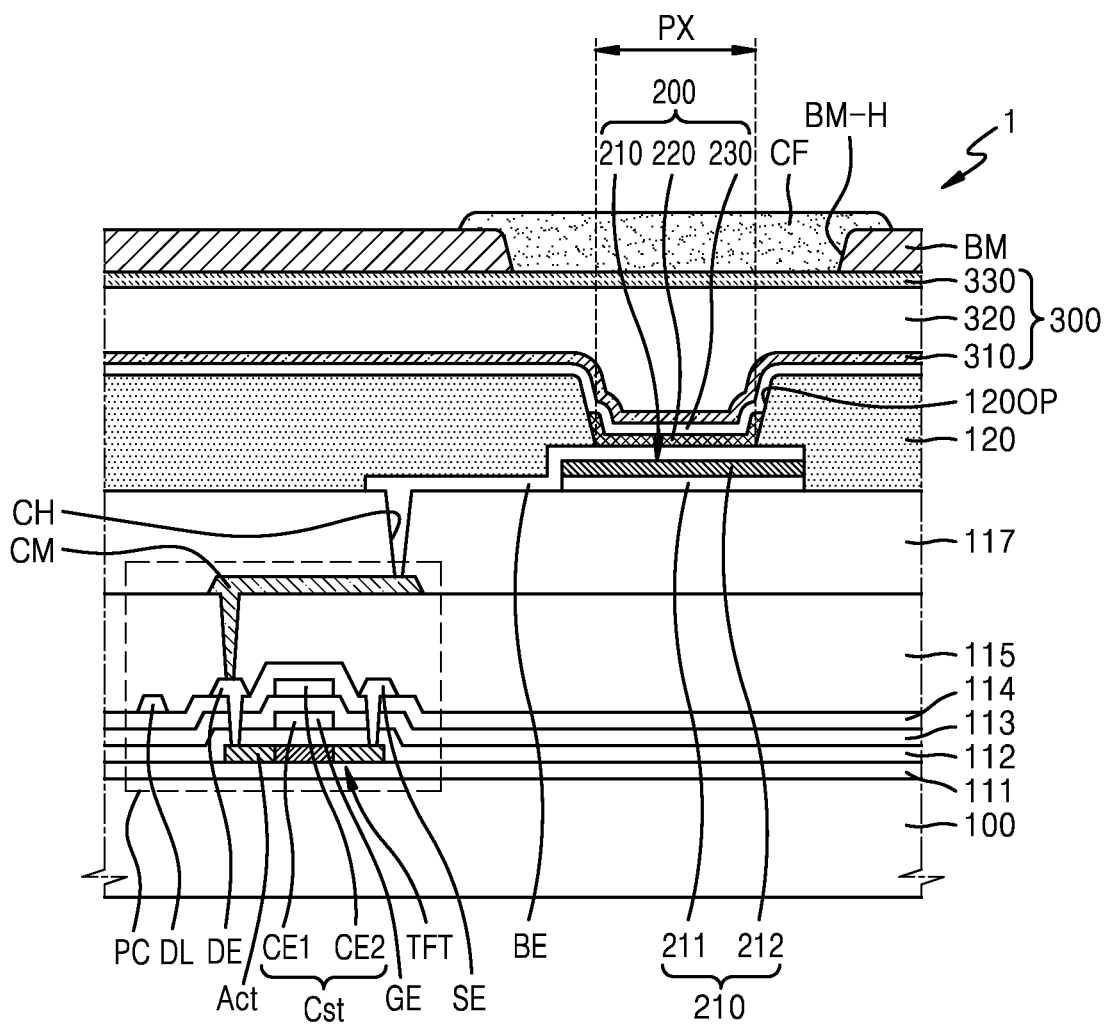

Referring to FIG. 10J, an encapsulation layer 300 including a first inorganic encapsulation layer 310, an organic encapsulation layer 320, and a second inorganic encapsulation layer 330 may be formed over the opposite electrode 230. A black matrix BM, a color filter CF, and the like may be formed over the encapsulation layer 300. Accordingly, the display apparatus 1 described above with reference to FIG. 4 may be provided.

Although the method of manufacturing the display apparatus 1 of FIG. 4 has been described above, a display apparatus of other embodiments may also be manufactured through a modification of the present method. For example, the above method of manufacturing the display apparatus may be similarly applied to manufacture the display apparatus 1 of FIG. 5. In this case, in FIG. 10C, the pixel electrode material layer 210*m* may further include an upper conductive layer material layer (not illustrated) over the reflective layer material layer 212*m*. As the upper conductive layer material layer of the pixel electrode material layer 210*m* is patterned, an upper conductive layer 213 (see FIG. 5) may be formed. Thus, a pixel electrode 210 including a lower conductive layer 211, a reflective layer 212, and an upper conductive layer 213 may be formed. In this case, when the bridge electrode BE is formed over the pixel electrode 210, the upper conductive layer 213 may protect the reflective layer 212 and prevent oxidization of the reflective layer 212.

FIGS. 11A to 11F are cross-sectional views schematically illustrating operations of a method of manufacturing a display apparatus according to other embodiments. The display apparatus manufactured according to the present manufacturing method may correspond to the display apparatus of FIG. 6, like reference numerals will denote like elements, and thus redundant descriptions thereof will be omitted for conciseness.

Figure 11A:
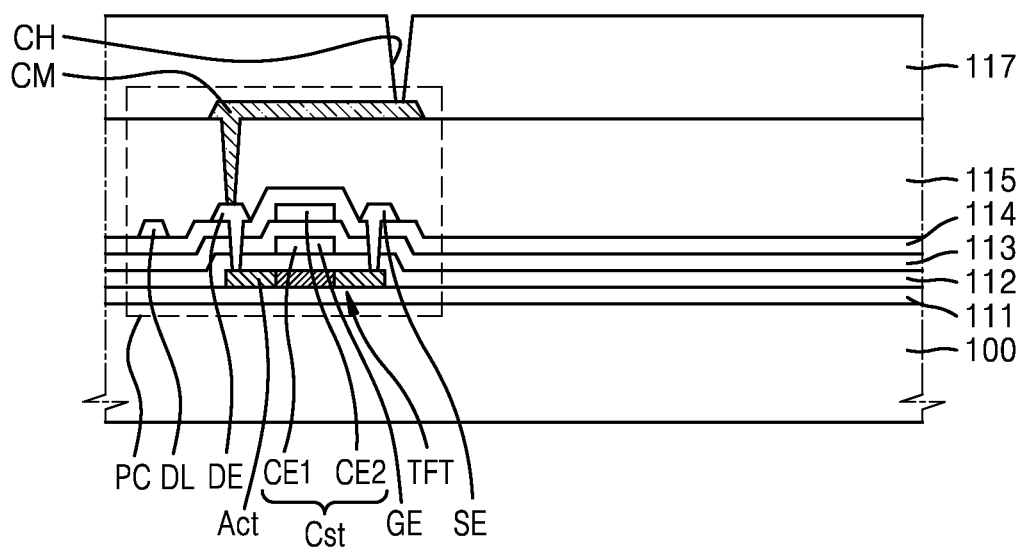
FIGS. 11A, 11B, 11C, 11D, 11E and 11F are cross-sectional views schematically illustrating operations of a method of manufacturing a display apparatus according to other embodiments.

Referring to FIG. 11A, a pixel circuit PC including a thin film transistor TFT and a storage capacitor Cst may be formed over a substrate 100. Also, a second organic insulating layer 117 covering the pixel circuit PC and including at least one contact hole CH may be formed. FIG. 11A illustrates a state in which a buffer layer 111 has been formed over the substrate 100 and the second organic insulating layer 117 has been formed, which may be the same as that of FIG. 10B.

Figure 11B:
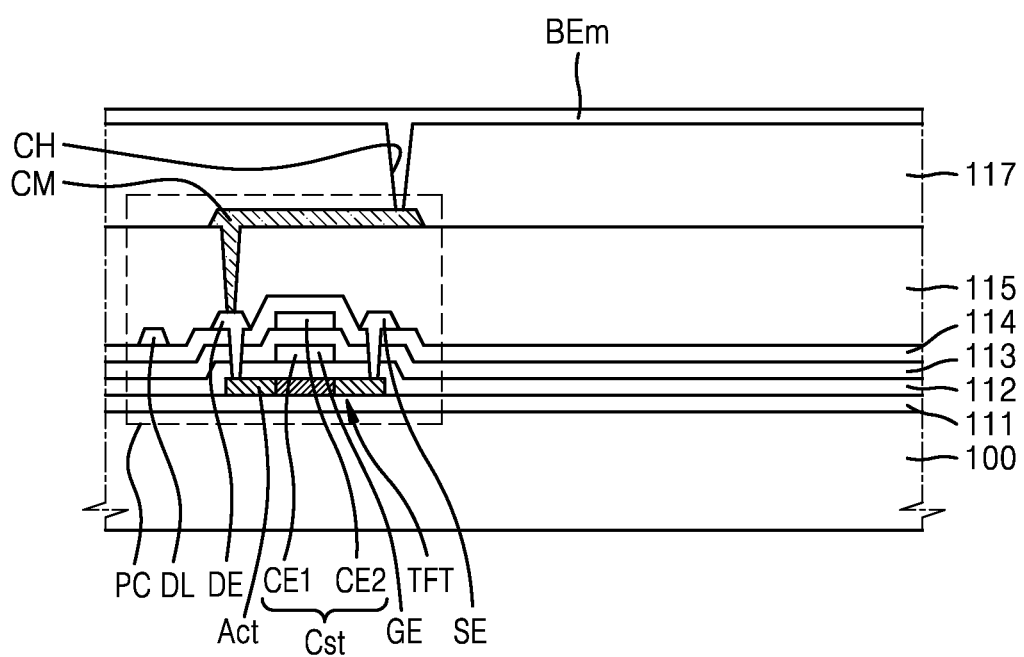
Figure 11C:
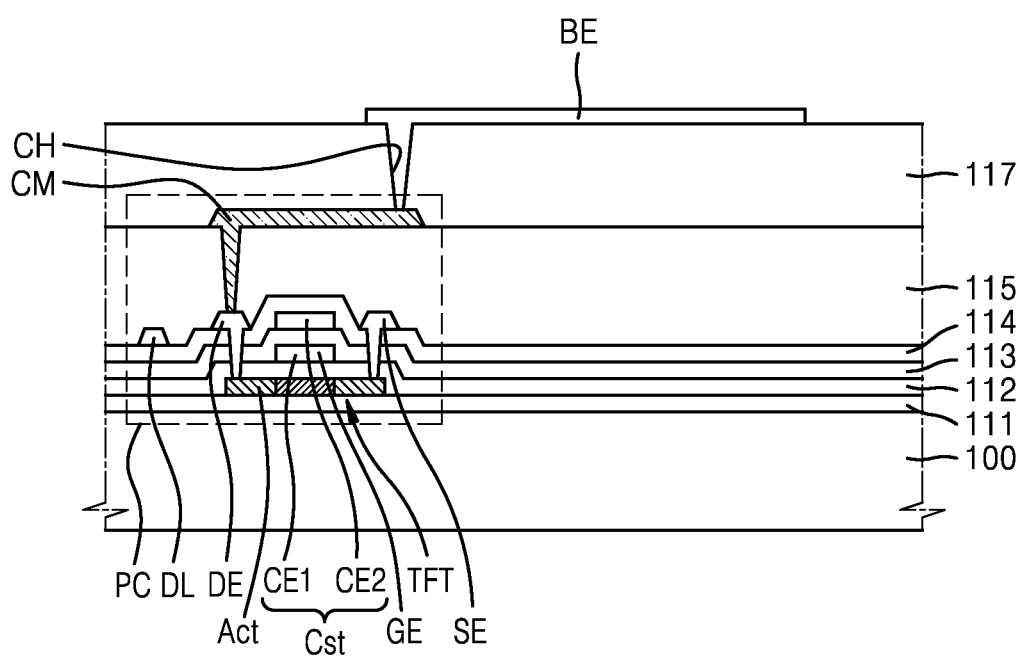

Referring to FIGS. 11B and 11C, before formation of a pixel electrode 210, a bridge electrode BE may be first formed over the second organic insulating layer 117. For this purpose, as illustrated in FIG. 11B, a bridge electrode material layer BEm may be formed over the second organic insulating layer 117. The bridge electrode material layer BEm may be formed through, for example, a coating process using spin coating or the like or a deposition process using physical vapor deposition (PVD) such as sputtering or e-beam evaporation.

Next, as illustrated in FIG. 11C, the bridge electrode material layer BEm may be patterned to form the bridge electrode BE, wherein the bridge electrode material layer BEm may be patterned such that at least a portion of the bridge electrode BE may overlap the opening 120OP (see FIG. 6) of the pixel definition layer 120 (see FIG. 6) in the plan view. Also, the bridge electrode BE may be patterned to overlap the contact hole CH of the second organic insulating layer 117 such that the bridge electrode BE may be connected to the pixel circuit PC through the contact hole CH. The patterning may be performed through a photolithography process. In an embodiment, the bridge electrode BE may include a transparent conductive oxide as described above.

Figure 11D:
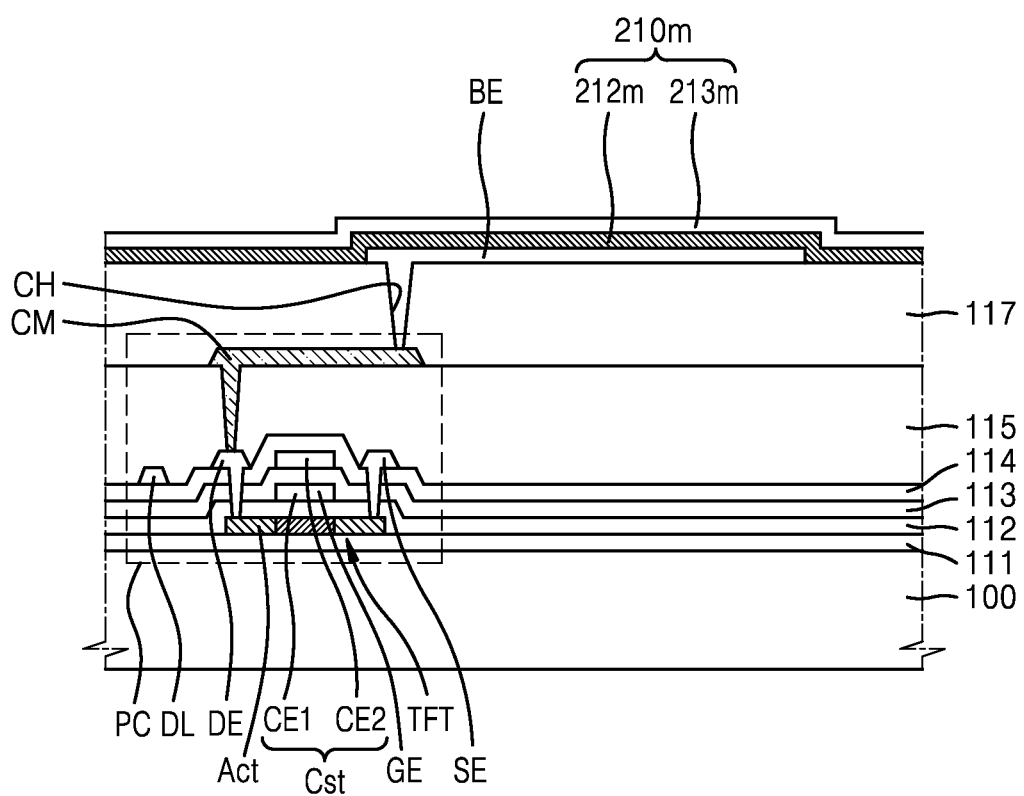
Figure 11E:
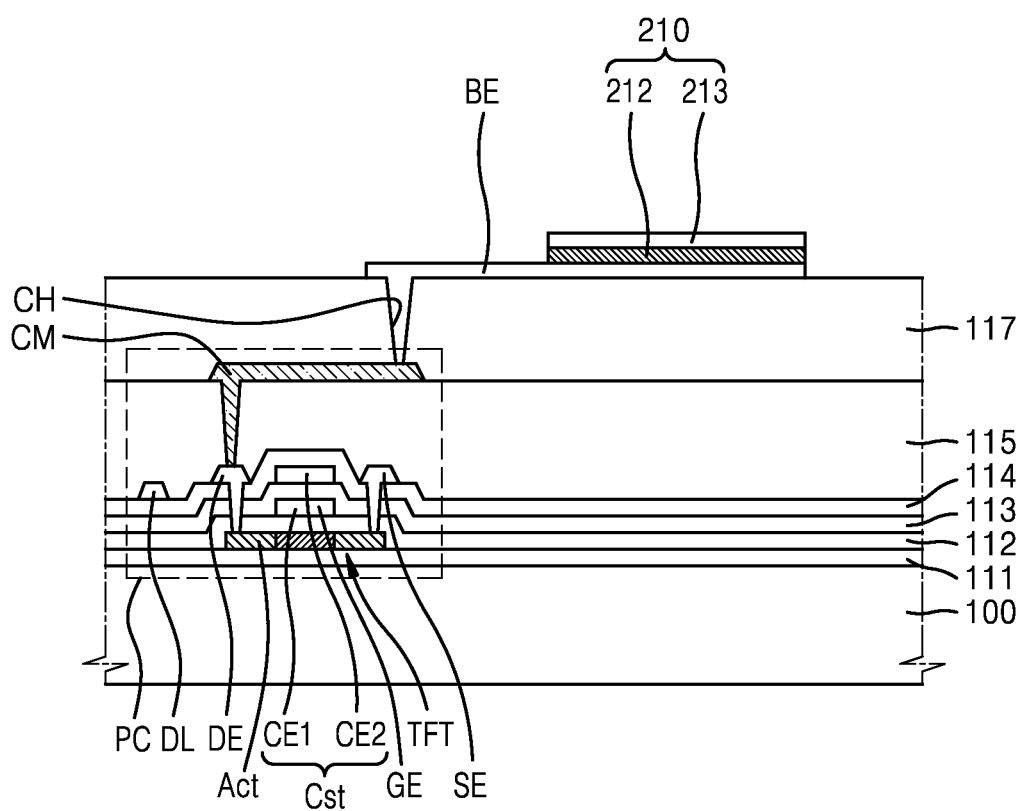

Referring to FIGS. 11D and 11E, a pixel electrode 210 may be formed over the bridge electrode BE. For this purpose, first, as illustrated in FIG. 11D, a pixel electrode material layer 210m may be formed over the second organic insulating layer 117. In an embodiment, the pixel electrode material layer 210m may include a reflective layer material layer 212m and an upper conductive layer material layer 213m over the reflective layer material layer 212m. The pixel electrode material layer 210m may be formed through, for example, a coating process using spin coating or the like or a deposition process using physical vapor deposition (PVD) such as sputtering or e-beam evaporation.

Next, as illustrated in FIG. 11E, the pixel electrode material layer 210m may be patterned to form the pixel electrode 210, wherein the pixel electrode material layer 210m may be patterned such that the pixel electrode 210 may not overlap the contact hole CH of the second organic insulating layer 117 in the plan view. For example, the patterning may be performed through a photolithography process.

For example, the reflective layer material layer 212m and the upper conductive layer material layer 213m of the pixel electrode material layer 210m may be patterned together by the same process. The reflective layer material layer 212m may be patterned to form a reflective layer 212 and the upper conductive layer material layer 213m may be patterned to form an upper conductive layer 213 and thus a pixel electrode 210 including the reflective layer 212 and the upper conductive layer 213 may be formed. In an embodiment, the upper conductive layer 213 may include a transparent conductive oxide and the reflective layer 212 may include a metal as described above.

Figure 11F:
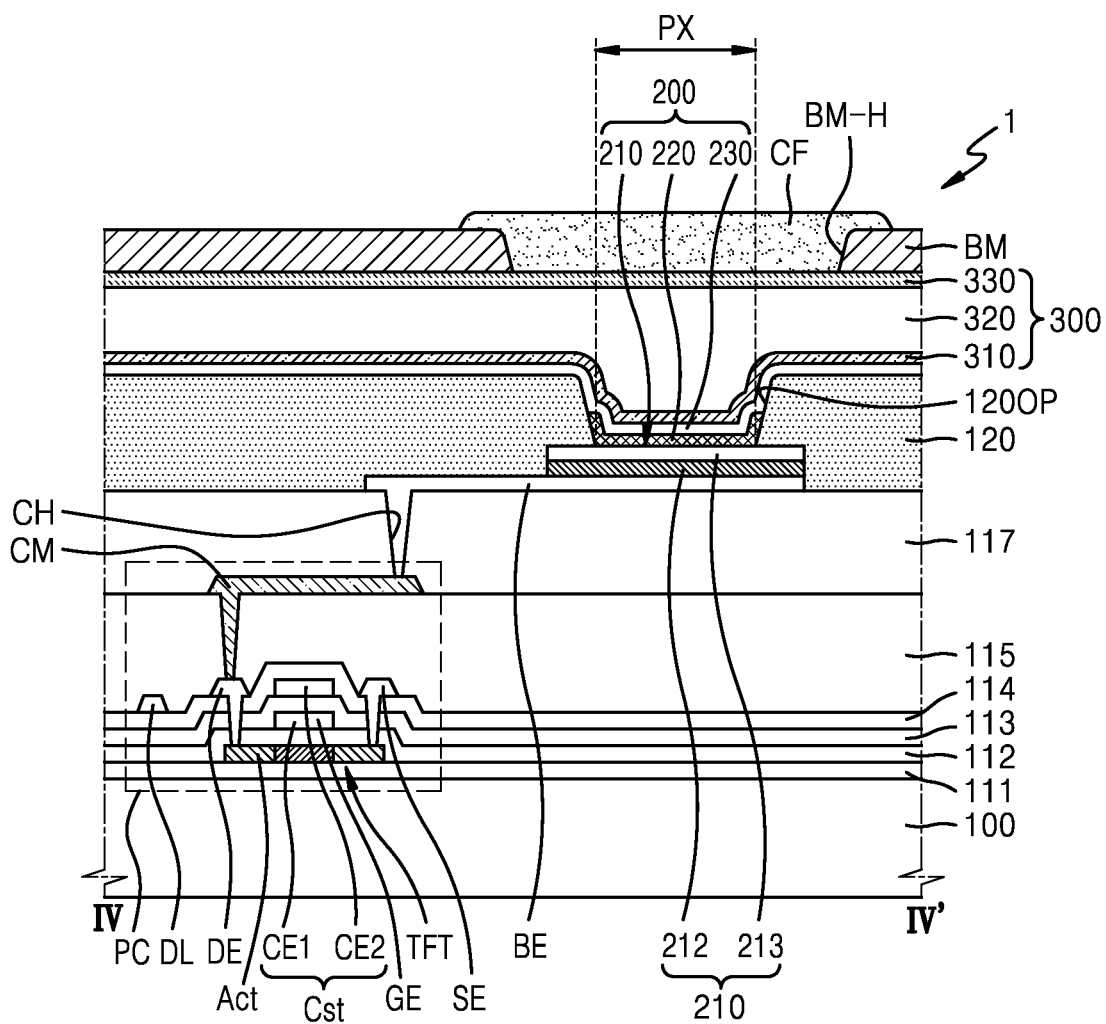

Referring to FIG. 11F, a pixel definition layer 120 disposed over the pixel electrode 210 and defining an opening 120OP overlapping a portion of the pixel electrode 210 may be formed. Thereafter, an intermediate layer 220 over the pixel electrode 210 and an opposite electrode 230 over the intermediate layer 220 may be formed. An encapsulation layer 300 including a first inorganic encapsulation layer 310, an organic encapsulation layer 320, and a second inorganic encapsulation layer 330 may be formed over the opposite electrode 230, and a black matrix BM, a color filter CF, and the like may be formed over the encapsulation layer 300. A method of forming the pixel definition layer 120, the intermediate layer 220, the opposite electrode 230, the encapsulation layer 300, the black matrix BM, the color filter CF, and the like may be the same as that described above with reference to FIGS. 10F to 10J. Accordingly, the display apparatus 1 described above with reference to FIG. 6 may be provided.

Although the method of manufacturing the display apparatus 1 of FIG. 5 has been described above, a display apparatus of other embodiments may also be manufactured through a modification of the present method. For example, the above method of manufacturing the display apparatus may be similarly applied to manufacture the display apparatus 1 of FIG. 7. In this case, in FIG. 11D, the pixel electrode material layer 210m may further include a lower conductive layer material layer (not illustrated) under the reflective layer material layer 212m. As the lower conductive layer material layer of the pixel electrode material layer 210m is patterned, a lower conductive layer 211 (see FIG. 7) may be formed. Thus, a pixel electrode 210 including a lower conductive layer 211, a reflective layer 212, and an upper conductive layer 213 may be formed.

FIGS. 12A to 12E are cross-sectional views schematically illustrating operations of a method of manufacturing a display apparatus according to other embodiments. The display apparatus manufactured according to the present manufacturing method may correspond to the display apparatus of FIG. 8, like reference numerals will denote like elements, and thus redundant descriptions thereof will be omitted for conciseness.

Figure 12A:
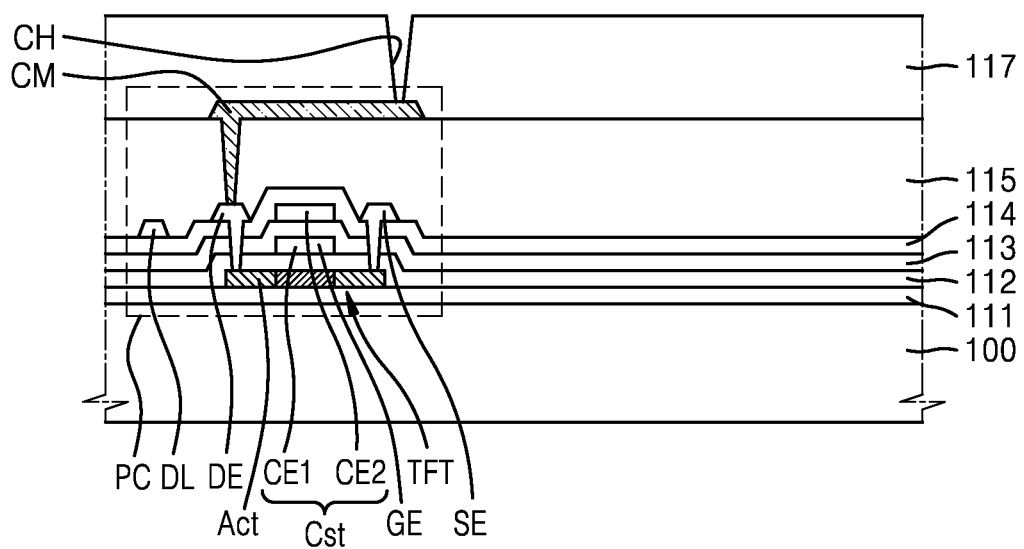
FIGS. 12A, 12B, 12C, 12D and 12E are cross-sectional views schematically illustrating operations of a method of manufacturing a display apparatus according to other embodiments.

Referring to FIG. 12A, a pixel circuit PC including a thin film transistor TFT and a storage capacitor Cst may be formed over a substrate 100. Also, a second organic insulating layer 117 covering the pixel circuit PC and including at least one contact hole CH may be formed. FIG. 12A illustrates a state in which a buffer layer 111 has been formed over the substrate 100 and the second organic insulating layer 117 has been formed, which may be the same as that of FIG. 11A.

Figure 12B:
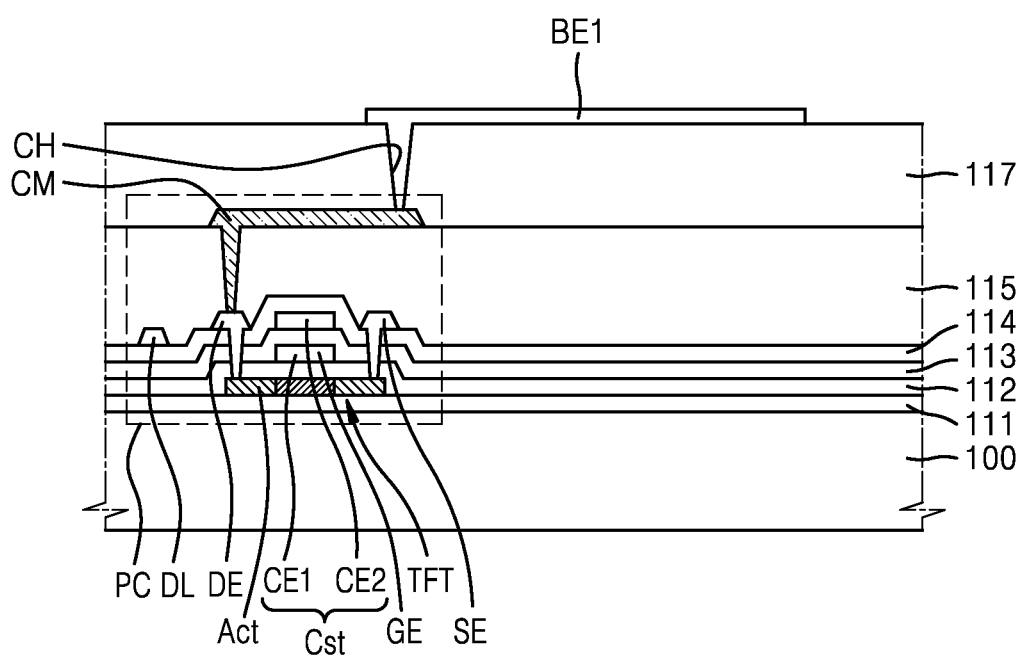

Referring to FIG. 12B, a first bridge electrode layer BE1 disposed over the second organic insulating layer 117 and electrically connected to the pixel circuit PC through at least one contact hole CH of the second organic insulating layer 117 may be formed. A first bridge electrode layer material layer (not illustrated) may be first formed through a coating process or a deposition process and the first bridge electrode layer material layer may be patterned through a photolithography process to form the first bridge electrode layer BE1. Also, the first bridge electrode layer BE1 may be patterned to overlap the contact hole CH of the second organic insulating layer 117 such that the first bridge electrode layer BE1 may be connected to the pixel circuit PC through the contact hole CH. In an embodiment, the first bridge electrode layer BE1 may include a transparent conductive oxide as described above.

Figure 12C:
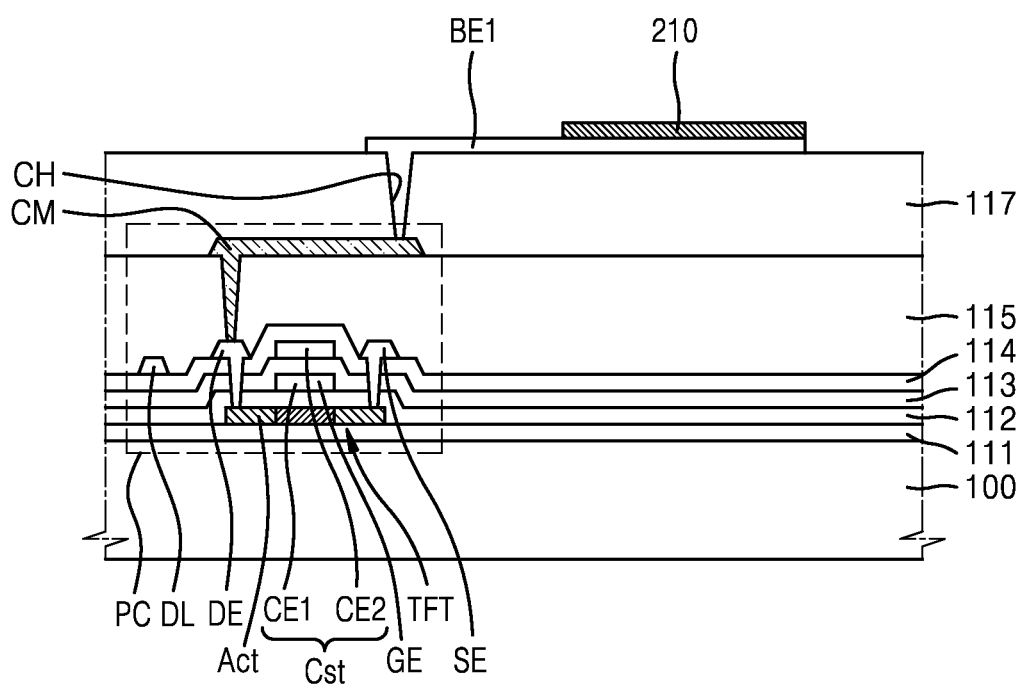

Referring to FIG. 12C, a pixel electrode 210 disposed over the first bridge electrode layer BE1 may be formed. A pixel electrode material layer (not illustrated) may be first formed through a coating process or a deposition process and the pixel electrode material layer may be patterned through a photolithography process to form the pixel electrode 210. In this case, the pixel electrode material layer may be patterned such that the pixel electrode 210 may not overlap the contact hole CH of the second organic insulating layer 117 in the plan view.

Although FIG. 12C illustrates that the pixel electrode 210 has a single-layer structure, it will be understood that the present method may also be applied when the pixel electrode 210 has a multilayer structure including a reflective layer and a conductive layer.

Figure 12D:
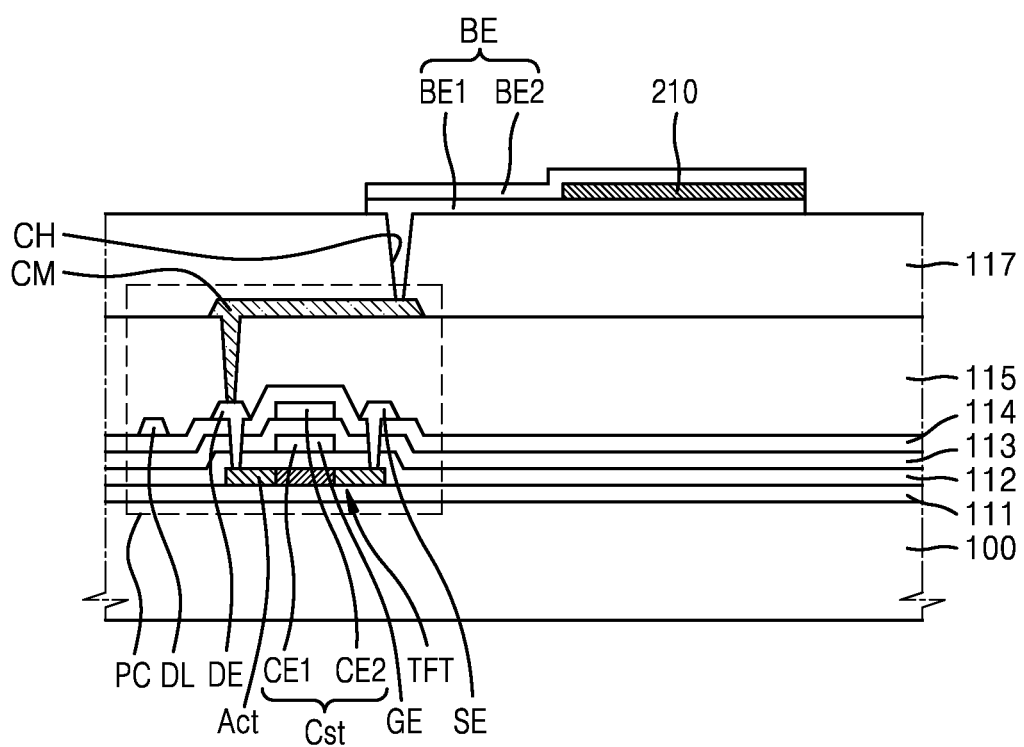

Referring to FIG. 12D, a second bridge electrode layer BE2 disposed over the first bridge electrode layer BE1 with the pixel electrode 210 disposed therebetween may be formed. Like the formation of the first bridge electrode layer BE1 a second bridge electrode layer material layer (not illustrated) may be first formed through a coating process or a deposition process and the second bridge electrode layer material layer may be patterned through a photolithography process to form the second bridge electrode layer BE2. At least a portion of the second bridge electrode layer BE2 may be patterned to directly contact the first bridge electrode layer BE1. In an embodiment, the second bridge electrode layer BE2 may include a transparent conductive oxide as described above.

The process of forming the first bridge electrode layer BE1, the pixel electrode 210 and the second bridge electrode layer BE2 described in FIGS. 12B, 12C and 12D may be modified to reduce process steps. A first bridge electrode layer material layer (not illustrated) disposed over the second organic insulating layer 117 and electrically connected to the pixel circuit PC through at least one contact hole CH of the second organic insulating layer 117 may be formed. A pixel electrode 210 disposed over the first bridge electrode layer material layer (not illustrated) may be formed. A pixel electrode material layer (not illustrated) may be first formed through a coating process or a deposition process and the pixel electrode material layer may be patterned through a photolithography process and an etching process to form the pixel electrode 210. A second bridge electrode layer material layer (not illustrated) may be formed through a coating process or a deposition process. The first bridge electrode layer material layer and the second bridge electrode layer material layer may be simultaneously patterned through a photolithography process to form the first bridge electrode layer BE1 and the second bridge electrode layer BE2.

Figure 12E:
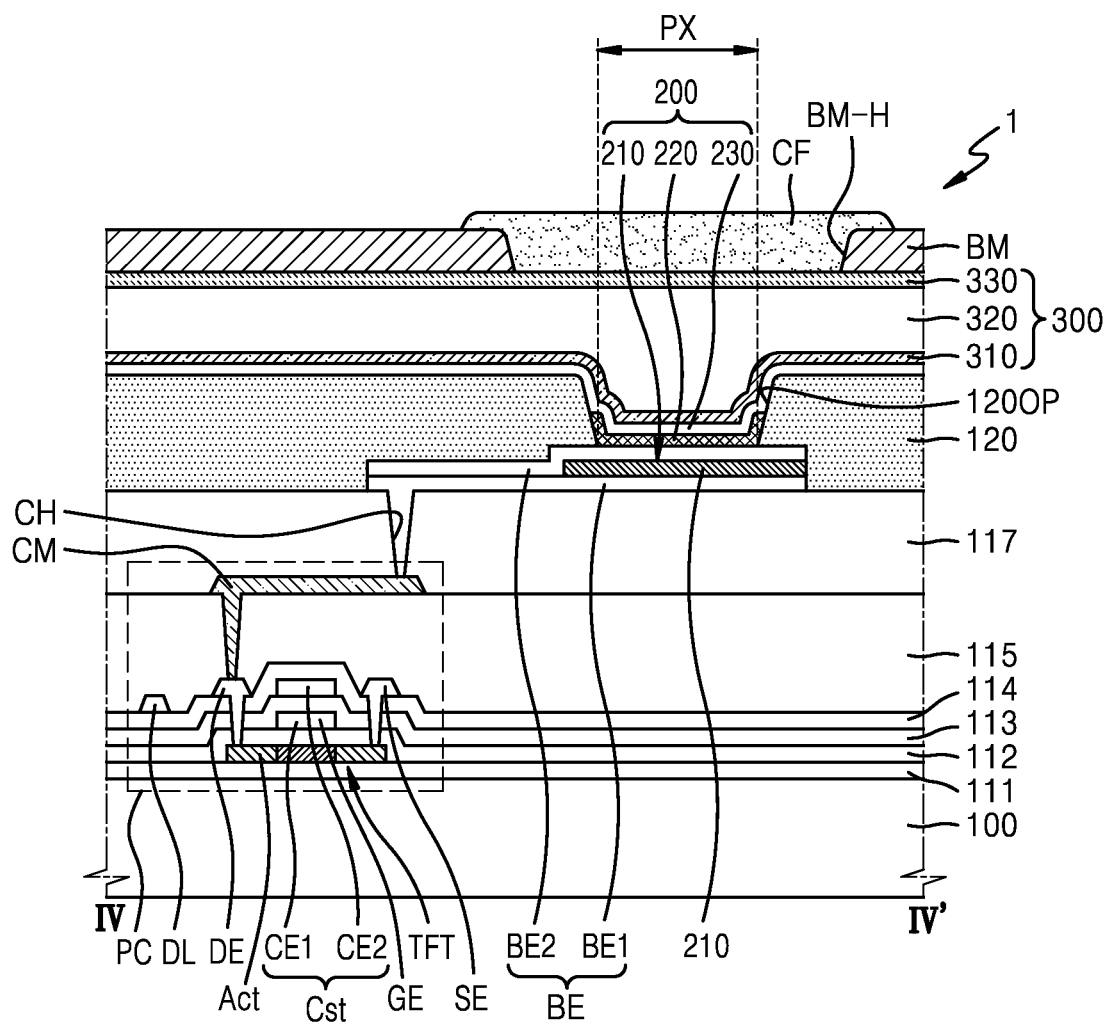

Referring to FIG. 12E, a pixel definition layer 120 disposed over the pixel electrode 210 and defining an opening 120OP overlapping a portion of the pixel electrode 210 may be formed. The opening 120OP of the pixel definition layer 120 may overlap not only the pixel electrode 210 but also the first and second bridge electrode layers BE1 and BE2 respectively disposed under and over the pixel electrode 210.

Thereafter, an intermediate layer 220 over the pixel electrode 210 and an opposite electrode 230 over the intermediate layer 220 may be formed. An encapsulation layer 300 including a first inorganic encapsulation layer 310, an organic encapsulation layer 320, and a second inorganic encapsulation layer 330 may be formed over the opposite electrode 230, and a black matrix BM, a color filter CF, and the like may be formed over the encapsulation layer 300. A method of forming the pixel definition layer 120, the intermediate layer 220, the opposite electrode 230, the encapsulation layer 300, the black matrix BM, the color filter CF, and the like may be the same as that described above with reference to FIGS. 10F to 10J. Accordingly, the display apparatus 1 described above with reference to FIG. 8 may be provided.

Although the method of manufacturing the display apparatus 1 of FIG. 8 has been described above, a display apparatus of other embodiments may also be manufactured through a modification of the present method. For example, the above method of manufacturing the display apparatus may be similarly applied to manufacture the display apparatus 1 of FIG. 9.

As described above, according to an embodiment, it may be possible to implement a display apparatus in which the area of a pixel electrode is reduced through a bridge electrode electrically connecting a pixel circuit to the pixel electrode and thus an external light reflectance at the surface thereof is reduced and a method of manufacturing the display apparatus. However, the scope of the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate;
    a pixel circuit disposed over the substrate and comprising a thin film transistor and a storage capacitor;
    an insulating layer covering the pixel circuit;
    a bridge electrode disposed over the insulating layer and electrically connected to the thin film transistor through a contact hole formed in the insulating layer;
    a pixel electrode disposed over the insulating layer and electrically connected to the thin film transistor via the bridge electrode which is connected to the thin film transistor through the contact hole;
    a pixel definition layer disposed over the pixel electrode and including an opening overlapping a portion of the pixel electrode;
    an opposite electrode disposed over the pixel electrode; and
    an emission layer disposed between the pixel electrode and the opposite electrode,
    wherein the pixel electrode does not overlap the contact hole of the insulating layer in a plan view, and
    wherein at least a portion of the bridge electrode and the pixel electrode overlap in an area corresponding to the opening of the pixel definition layer in a plan view.

2. The display apparatus of claim 1, wherein the at least a portion of the bridge electrode is disposed over the pixel electrode.

3. The display apparatus of claim 2, wherein the pixel electrode comprises:
    a conductive layer comprising a transparent conductive oxide; and
    a reflective layer disposed over the conductive layer and comprising a metal, and
    wherein the at least a portion of the bridge electrode contacts an upper surface of the reflective layer of the pixel electrode.

4. The display apparatus of claim 2, wherein the pixel electrode comprises:
    a lower conductive layer comprising a transparent conductive oxide;
    a reflective layer disposed over the lower conductive layer and comprising a metal; and
    an upper conductive layer disposed over the reflective layer and comprising a transparent conductive oxide, and
    wherein the at least a portion of the bridge electrode contacts an upper surface of the upper conductive layer of the pixel electrode.

5. The display apparatus of claim 1, wherein the at least a portion of the bridge electrode is disposed between the insulating layer and the pixel electrode.

6. The display apparatus of claim 5, wherein the pixel electrode comprises:
    a reflective layer comprising a metal; and
    a conductive layer disposed over the reflective layer and comprising a transparent conductive oxide, and
    wherein the at least a portion of the bridge electrode contacts a lower surface of the reflective layer of the pixel electrode.

7. The display apparatus of claim 5, wherein the pixel electrode comprises:
    a lower conductive layer comprising a transparent conductive oxide;

a reflective layer disposed over the lower conductive layer and comprising a metal; and an upper conductive layer disposed over the reflective layer and comprising a transparent conductive oxide, and wherein the at least a portion of the bridge electrode contacts a lower surface of the lower conductive layer of the pixel electrode.

8. The display apparatus of claim 1, wherein the bridge electrode comprises:

a first bridge electrode layer disposed between the insulating layer and the pixel electrode; and a second bridge electrode layer disposed over the first bridge electrode layer, and wherein the pixel electrode is disposed between the first bridge electrode layer and the second bridge electrode layer of the bridge electrode.

9. The display apparatus of claim 8, wherein the pixel electrode comprises a reflective layer comprising a metal, and wherein the first bridge electrode layer contacts a lower surface of the reflective layer of the pixel electrode.

10. The display apparatus of claim 9, wherein the pixel electrode further comprises a conductive layer disposed over the reflective layer and comprising a transparent conductive oxide, and wherein the second bridge electrode layer contacts an upper surface of the conductive layer of the pixel electrode.

11. The display apparatus of claim 1, wherein the bridge electrode comprises a transparent conductive oxide.

12. The display apparatus of claim 1, wherein the pixel definition layer comprises a light blocking material.

13. The display apparatus of claim 1, wherein the pixel electrode is completely overlapped with the bridge electrode in a plan view.

14. The display apparatus of claim 1, wherein the bridge electrode is disposed over the pixel electrode.

15. A display apparatus comprising:

a substrate;

a pixel circuit disposed over the substrate and comprising a thin film transistor and a storage capacitor;

an insulating layer covering the pixel circuit;

a bridge electrode disposed over the insulating layer and electrically connected to the thin film transistor through a contact hole formed in the insulating layer;

a pixel electrode disposed over the insulating layer and electrically connected to the thin film transistor via the bridge electrode which is connected to the thin film transistor through the contact hole;

a pixel definition layer disposed over the pixel electrode and including an opening overlapping a portion of the pixel electrode;

an opposite electrode disposed over the pixel electrode; and an emission layer disposed between the pixel electrode and the opposite electrode, wherein the pixel electrode does not overlap the contact hole of the insulating layer in a plan view, and wherein an area of the bridge electrode is greater than an area of the pixel electrode in a plan view.

\* \* \* \* \*